(12) United States Patent
Kim et al.

(10) Patent No.: US 11,922,841 B2
(45) Date of Patent: Mar. 5, 2024

(54) DISPLAY DEVICE CAPABLE OF INSPECTING MISALIGNMENT OF LAYERS

(71) Applicant: Samsung Display Co., Ltd., Yongin-Si (KR)

(72) Inventors: Yoon Ho Kim, Asan-si (KR); Jong Woo Park, Seongnam-si (KR); June Hwan Kim, Daejeon (KR); Ki Ju Im, Suwon-si (KR); Young Tae Choi, Asan-si (KR); Hyuncheol Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/950,174

(22) Filed: Sep. 22, 2022

(65) Prior Publication Data

US 2023/0261007 A1   Aug. 17, 2023

(30) Foreign Application Priority Data

Feb. 16, 2022   (KR) ........................ 10-2022-0020425

(51) Int. Cl.
*G09G 3/00*    (2006.01)
*H01L 27/12*   (2006.01)

(52) U.S. Cl.
CPC ........... *G09G 3/006* (2013.01); *H01L 27/124* (2013.01); *G09G 2300/0426* (2013.01); *G09G 2330/12* (2013.01)

(58) Field of Classification Search
CPC .. H01L 27/124; G09G 3/006; G09G 2330/12; G09G 2300/0426; G09G 2300/0439
See application file for complete search history.

(56) References Cited

U.S. PATENT DOCUMENTS

| 11,367,391 | B2 * | 6/2022 | Zhou | ........................ G09G 3/00 |
| 2005/0082968 | A1 * | 4/2005 | Choi | ................... H01L 31/1055 |
| | | | | 313/506 |
| 2018/0053792 | A1 * | 2/2018 | Shin | ..................... H01L 27/1244 |
| 2019/0115407 | A1 * | 4/2019 | Cho | ..................... H01L 27/1262 |
| 2020/0073495 | A1 * | 3/2020 | Bok | ...................... G06F 1/1616 |
| 2022/0208801 | A1 * | 6/2022 | Itoh | ...................... G09G 3/3648 |

FOREIGN PATENT DOCUMENTS

| KR | 10-2007-0000613 A | 1/2007 |
| KR | 10-1813785 B1 | 12/2017 |
| KR | 10-1835557 B1 | 3/2018 |
| KR | 10-2233719 B1 | 3/2021 |

* cited by examiner

*Primary Examiner* — Xuemei Zheng
(74) *Attorney, Agent, or Firm* — Innovation Counsel LLP

(57) ABSTRACT

The present disclosure relates to a display device, and the display device according to an embodiment includes: a substrate including a display area and a peripheral area; a plurality of light-emitting elements positioned in a display area; a plurality of pixel circuits connected to a plurality of light-emitting elements, respectively; a sensor positioned on the peripheral area of the substrate; a leakage current detecting circuit connected to the sensor; and a light emitting wiring connected to the leakage current detecting circuit and connected to at least one of the plurality of light-emitting elements, wherein the sensor includes a first sensor and the first sensor includes a first sensing transistor, and a first conductive pattern spaced apart from the channel of the first sensing transistor, and the first conductive pattern is positioned in the same layer as at least one of a plurality of layers configuring the transistor.

19 Claims, 22 Drawing Sheets

DISPLAY DEVICE CAPABLE OF INSPECTING MISALIGNMENT OF LAYERS

CROSS-REFERENCE TO RELATED APPLICATION

This application claims priority to and the benefit of Korean Patent Application No. 10-2022-0020425 filed in the Korean Intellectual Property Office on Feb. 16, 2022, the entire contents of which are incorporated herein by reference.

BACKGROUND

1. Field

The present disclosure relates to a display device.

2. Description of the Related Art

A display device is a device for displaying an image and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device may include various wirings, electrodes, insulating layers, etc. positioned on different layers. Such wirings, etc. may be formed through processes such as deposition, a photo process, and etching. The photo process includes an exposure and development process, and a photomask may be used during the exposure process. A predetermined pattern is formed in the photomask. In the photomask, light cannot pass through the portion where the pattern is formed, and light can pass through the portion where the pattern is not formed.

In order to form a plurality of wirings, etc. positioned on different layers, a number of photo processes may be performed using different photomasks for each layer. At this time, if the positions corresponding to the photomasks are misaligned, the wirings, etc. may be shifted from the originally designed position and formed. Accordingly, the characteristics of the elements constituting the display device may be changed and defects may occur.

The above information disclosed in this Background section is only for enhancement of understanding of the background of the described technology, and therefore it may contain information that does not form the prior art that is already known in this country to a person of ordinary skill in the art.

SUMMARY

Exemplary embodiments are to provide a display device capable of inspecting whether wirings, etc. of each layer constituting the display device are formed in a designed position.

A display device according to an embodiment includes: a substrate including a display area and a peripheral area; a plurality of light-emitting elements positioned in a display area; a plurality of pixel circuits connected to a plurality of light-emitting elements, respectively; a sensor positioned on the peripheral area of the substrate; a leakage current detecting circuit connected to the sensor; and a light emitting wiring connected to the leakage current detecting circuit and connected to at least one of the plurality of light-emitting elements, wherein the sensor includes a first sensor, the first sensor includes a first sensing transistor, and a first conductive pattern spaced apart from a channel of the first sensing transistor, and the first conductive pattern is positioned in the same layer as at least one of a plurality of layers configuring the transistor.

The each of the plurality of transistor pixel circuits may include a polycrystalline transistor and an oxide transistor, and the polycrystalline transistor may include: a polycrystalline semiconductor; a gate electrode overlapping a channel of the polycrystalline transistor; and a storage electrode overlapping the gate electrode, and the oxide transistor may include: a light blocking layer; an oxide semiconductor disposed on the light blocking layer to overlap the light blocking layer; and a gate electrode overlapping a channel of the oxide transistor.

The first sensing transistor may be positioned on the first conductive pattern.

The first sensing transistor may include: a semiconductor; and a gate electrode overlapping the channel of the first sensing transistor, the semiconductor of the first sensing transistor may be positioned on the same layer as the oxide semiconductor of the oxide transistor, and the gate electrode of the first sensing transistor may be positioned on the same layer as the gate electrode of the oxide transistor.

The first conductive pattern may be positioned on the same layer as the light blocking layer.

The first conductive pattern may include: a first upper conductive pattern disposed adjacent to the upper edge of the channel of the first sensing transistor; a first right conductive pattern disposed adjacent to the right edge of the channel of the first sensing transistor; a first lower conductive pattern disposed adjacent to the lower edge of the semiconductor of the first sensing transistor; and a first left conductive pattern disposed adjacent to the left edge of the channel of the first sensing transistor.

The first upper conductive pattern may be spaced apart from the channel of the first sensing transistor to have a first interval, the first right conductive pattern is spaced apart from the channel of the first sensing transistor to have a second interval, the first lower conductive pattern is spaced apart from the channel of the first sensing transistor to have a third interval, and the first left conductive pattern is spaced apart from the channel of the first sensing transistor to have a fourth interval.

The first interval, the second interval, the third interval, and the fourth interval may be designed to be the same.

The leakage current detecting circuit may detect the leakage current of the first sensing transistor caused by a difference between the first interval, the second interval, the third interval, and the fourth interval.

The sensor may further include a second sensor, and the second sensor includes a second sensing transistor and a second conductive pattern spaced apart from a channel of the second sensing transistor, while the second sensing transistor may be positioned on the second conductive pattern.

The second sensing transistor may include a semiconductor, and a gate electrode overlapping a channel of the second sensing transistor, the semiconductor of the second sensing transistor may be positioned on the same layer as the oxide semiconductor of the oxide transistor, and the gate electrode of the second sensing transistor may be positioned on the same layer as the gate electrode of the oxide transistor.

The second conductive pattern may be positioned on the same layer as the gate electrode of the polycrystalline transistor.

The second conductive pattern may include: a second upper conductive pattern disposed adjacent to the upper edge of the channel of the second sensing transistor; a second right conductive pattern disposed adjacent to the right edge of the channel of the second sensing transistor; a second lower conductive pattern disposed adjacent to the lower edge of the channel of the second sensing transistor; and a second left conductive pattern disposed adjacent to the left edge of the channel of the second sensing transistor.

The sensor may further include a third sensor, the third sensor may include a third sensing transistor and a third conductive pattern spaced apart from a channel of the third sensing transistor, and the third sensing transistor may be positioned on the third conductive pattern.

The third sensing transistor may include a semiconductor and a gate electrode overlapping a channel of the third sensing transistor, the semiconductor of the third sensing transistor may be positioned on the same layer as the oxide semiconductor of the oxide transistor, and the gate electrode of the third sensing transistor may be positioned on the same layer as the gate electrode of the oxide transistor.

The third conductive pattern may be positioned on the same layer as the storage electrode of the polycrystalline transistor.

The third conductive pattern may include: a third upper conductive pattern disposed adjacent to the upper edge of the channel of the third sensing transistor; a third right conductive pattern disposed adjacent to the right edge of the channel of the third sensing transistor; a third lower conductive pattern disposed adjacent to the lower edge of the channel of the third sensing transistor; and a third left conductive pattern disposed adjacent to the left edge of the channel of the third sensing transistor.

A plurality of light-emitting elements may be disposed along a row direction and a column direction, and the light emitting wirings may be connected to a plurality of light-emitting elements disposed along one column.

The display device may include a plurality of sensors, and the leakage current detecting circuit may include a first leakage current detecting circuit connected to some of a plurality of sensors and a second leakage current detecting circuit connected to the rest of a plurality of sensors.

The light emitting wirings may include a first light emitting wiring connected to the first leakage current detecting circuit and a second light emitting wiring connected to the second leakage current detecting circuit, and the first light emitting wiring and the second light emitting wiring may be connected to the light-emitting element positioned in different columns.

According to embodiments, by inspecting and determining whether the wiring of each layer constituting the display device is formed in a designed position, it is possible to determine whether the device is defective.

DETAILED DESCRIPTION

Figure 1:
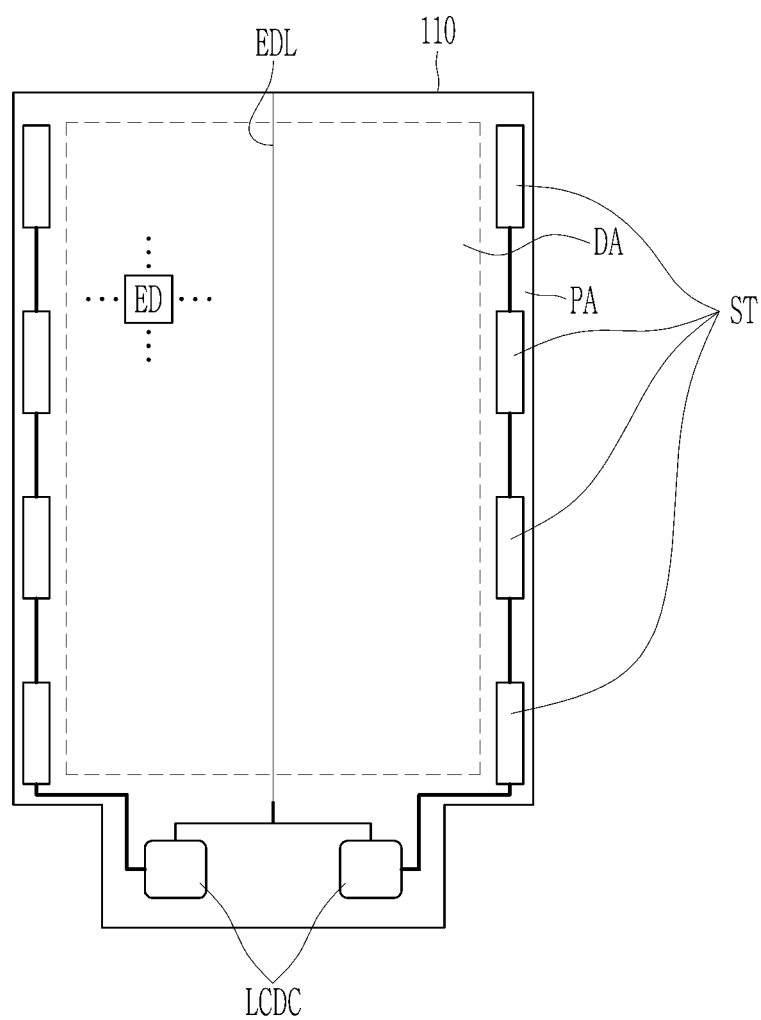
FIG. 1 is a schematic top plan view of a display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

Descriptions of parts not related to the present inventive concept are omitted, and like reference numerals designate like elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, the word "on" means positioning on or below the object portion, but does not necessarily mean positioning on the upper side of the object portion based on a direction of gravity.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

First, a display device according to an embodiment is described with reference to FIG. 1.

FIG. 1 is a schematic top plan view of a display device according to an embodiment.

As shown in FIG. 1, a display device according to an embodiment includes a substrate 110, and a light-emitting element ED and a sensing unit ST positioned on the substrate 110.

The substrate 110 includes a display area DA and a peripheral area PA disposed adjacent to the display area DA. The display area DA may have a substantially quadrangle shape and the peripheral area PA may be positioned to surround the display area DA. However, the positions of the display area DA and the peripheral area PA are not limited thereto, and may be variously changed.

The light-emitting element ED may be positioned in the display area DA of the substrate 110. The display device according to an embodiment may include a plurality of light-emitting elements ED, and a plurality of light-emitting elements ED may be disposed in various forms. For example, a plurality of light-emitting elements ED may be disposed along a row direction and a column direction. The display device according to an embodiment may further include a plurality of signal lines for transmitting signals for driving the light-emitting element ED, and each light-emitting element ED may be connected to these signal lines. Each light-emitting element ED may emit light of, for example, red, green, and blue or white. The display area DA may represent a predetermined image through light emitted from the light-emitting elements ED.

The sensor ST may be positioned in the peripheral area PA of the substrate 110. The display device according to an embodiment may include a plurality of sensors ST, and a plurality of sensors ST may be positioned on both sides of the display area DA. For example, a portion of the plurality of sensors ST may be positioned on the left side of the display area DA, and the remaining portion may be positioned on the right side of the display area DA. The display device according to an embodiment may further include a leakage current detecting circuit LCDC connected to the sensor ST to detect a leakage current generated from the sensor ST. The leakage current detecting circuit LCDC may be located in the peripheral area PA. The display device according to an embodiment may include at least one leakage current detecting circuit LCDC. For example, one of two leakage current detecting circuits LCDC may be connected to the sensors ST positioned on the left side of the display area DA and the other one may be connected with the sensors ST positioned on the right side of the display area DA.

The display device according to an embodiment may further include light emitting wiring EDL connected to a leakage current detecting circuit LCDC. The light emitting wiring EDL may extend from the leakage current detecting circuit LCDC to cross the display area PA and may be connected to the light-emitting element ED. For example, a plurality of light-emitting elements ED disposed along one column may be connected to the light emitting wiring EDL. The light emitting wiring EDL may be connected to a plurality of leakage current detecting circuits LCDC. When a leakage current is detected from at least one of a plurality of leakage current detecting circuits LCDC, a signal is transmitted along the light emitting wiring EDL, and the light-emitting element ED connected to the light emitting wiring EDL may emit light. That is, when a leakage current is detected, a band-shaped light emitting pattern may appear in the display area PA. Through this, it is possible to check whether a leakage current occurs.

Hereinafter a cross-sectional structure of the light-emitting element of the display device and the transistor connected thereto according to an embodiment is described with reference to FIG. 2.

Figure 2:
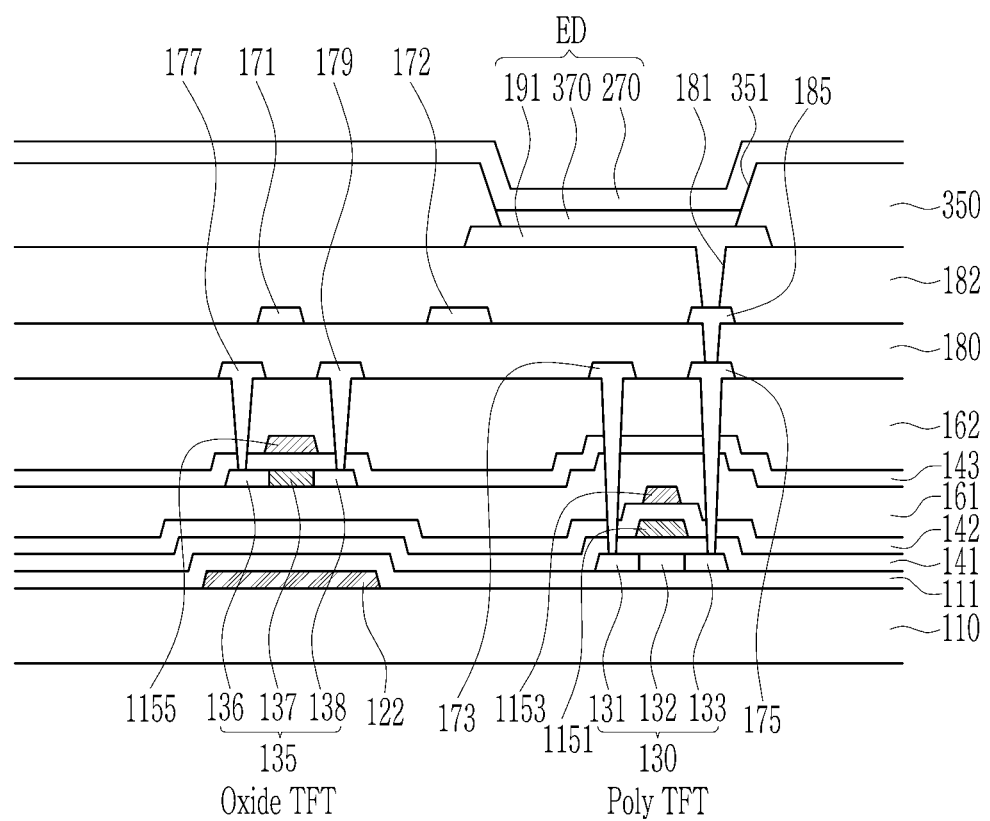
FIG. 2 is a cross-sectional view showing a part of a display area of a display device according to an embodiment.

FIG. 2 is a cross-sectional view showing a part of a display area of a display device according to an embodiment.

As shown in FIG. 2, a display device according to an embodiment includes a substrate 110, a polycrystalline transistor Poly TFT and an oxide transistor Oxide TFT positioned on the substrate 110, and a light-emitting element ED connected to the polycrystalline transistor Poly TFT.

The substrate 110 may include at least one among polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be a rigid substrate or a flexible substrate capable of bending, folding, rolling, etc. The substrate 110 may be single-layered or multi-layered structure. The substrate 110 may have a structure in which at least one base layer and at least one inorganic layer, including a polymer resin sequentially stacked, are alternately stacked.

On the substrate 110, the light blocking layer 122 of the oxide transistor TFT may be positioned. The light blocking layer 122 may have a single-layered or multi-layered structure. The light blocking layer 122 may include a metal material such as molybdenum (Mo), aluminum (Al), copper (Cu), and/or titanium (Ti). The light blocking layer 122 may overlap the semiconductor 135 of the oxide transistor TFT which is described later. The light blocking layer 122 may block light incident on the semiconductor 135 and may have a wider width than the semiconductor 131.

A buffer layer 111 may be positioned on the light blocking layer 122. The buffer layer 111 may have single-layered or multi-layered structure. The buffer layer 111 may include an inorganic insulating material such as a silicon nitride ($SiN_x$), a silicon oxide ($SiO_x$), or a silicon oxynitride ($SiO_xN_y$), or an organic insulating material. The buffer layer 111 may be omitted in some cases. In addition, a barrier layer may be further positioned between the substrate 110 and the buffer layer 111. The barrier layer may have a single-layered or multi-layered structure. The barrier layer may include an inorganic insulating material such as a silicon nitride ($SiN_x$), a silicon oxide ($SiO_x$), or a silicon oxynitride ($SiO_xN_y$).

A polycrystalline semiconductor layer including the semiconductor 130 of the polycrystalline transistor Poly TFT may be positioned on the buffer layer 111. The semiconductor 130 of the polycrystalline transistor Poly TFT may include a first region 131, a channel 132, and a second region 133. The first region 131 and the second region 133 may be respectively positioned on both sides of the channel 132 of the semiconductor 130 of the polycrystalline transistor Poly TFT. The semiconductor 130 of the polycrystalline transistor Poly TFT may include a semiconductor material such as polysilicon.

A first gate insulating layer 141 may be positioned on the polycrystalline semiconductor layer including the semiconductor 130 of the polycrystalline transistor Poly TFT. The first gate insulating layer 141 may have a single-layered or multi-layered structure. The first gate insulating layer 141 may include an inorganic insulating material such as a silicon nitride ($SiN_x$), a silicon oxide ($SiO_x$), or a silicon oxynitride ($SiO_xN_y$).

A first gate conductive layer including a gate electrode 1151 of a polycrystalline transistor Poly TFT may be positioned on the first gate insulating layer 141. The gate electrode 1151 of the polycrystalline transistor Poly TFT may overlap the channel 132 of the semiconductor 130. The first gate conductive layer may have a single-layered or multi-layered structure. The first gate conductive layer may include a metal material such as molybdenum (Mo), aluminum (Al), copper (Cu), and/or titanium (Ti).

After forming the first gate conductive layer, a doping process or plasma treatment may be performed. The part of the polycrystalline semiconductor layer covered by the first gate conductive layer is not doped or plasma-treated, and the part of the polycrystalline semiconductor layer that is not covered by the first gate conductive layer is doped or plasma-treated, so the part of the polycrystalline semiconductor layer that is not covered by the first gate conductive layer may have a predetermined conductivity. The doping process of the polycrystalline semiconductor layer may be performed with a p-type dopant, and the polycrystalline transistor Poly TFT including the polycrystalline semiconductor layer may have a p-type transistor characteristic.

A second gate insulating layer 142 may be positioned on the first gate conductive layer including the gate electrode 1151 of the polycrystalline transistor Poly TFT. The second gate insulating layer 142 may have a single-layered or multi-layered structure. The second gate insulating layer 142 may include an inorganic insulating material such as a silicon nitride ($SiN_x$), a silicon oxide ($SiO_x$), or a silicon oxynitride ($SiO_xN_y$).

A second gate conductive layer including a storage electrode 1153 may be positioned on the second gate insulating layer 142. The second gate conductive layer may have a single-layered or multi-layered structure. The second gate conductive layer may include a metal material such as molybdenum (Mo), aluminum (Al), copper (Cu), and/or titanium (Ti). The storage electrode 1153 may overlap the gate electrode 1151 of the polycrystalline transistor Poly TFT, thereby forming a storage capacitor.

A first interlayer insulating layer 161 may be positioned on the second gate conductive layer including the storage electrode 1153. The first interlayer insulating layer 161 may have a single-layered or multi-layered structure. The first interlayer insulating layer 161 may include an inorganic insulating material such as a silicon nitride ($SiN_x$), a silicon oxide ($SiO_x$), or a silicon oxynitride ($SiO_xN_y$).

An oxide semiconductor layer including a semiconductor 135 of the oxide transistor TFT may be positioned on the first interlayer insulating layer 161. The semiconductor 135 of the oxide transistor TFT may include a first region 136, a channel 137, and a second region 138. The first region 136 and the second region 138 may be positioned on both sides of the channel 137 of the semiconductor 135 of the oxide transistor TFT, respectively. The semiconductor 135 of the oxide transistor TFT may include an oxide semiconductor material.

The oxide semiconductor layer may include at least one among a primary metal oxide such as indium (In) oxide, tin (Sn) oxide, or zinc (Zn) oxide, a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a ternary metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include Indium-Gallium-Zinc Oxide (IGZO) among In—Ga—Zn-based oxides.

A third gate insulating layer 143 may be positioned on the oxide semiconductor layer including the semiconductor 135 of the oxide transistor TFT. The third gate insulating layer 143 may be positioned on the entire surface of the oxide semiconductor layer and the first interlayer insulating layer 161. Accordingly, the third gate insulating layer 143 may cover the upper surface and the side surface of the semiconductor 135 of the oxide transistor TFT. However, the present embodiment is not limited thereto, and the third gate insulating layer 143 may not be positioned on the entire surface on the oxide semiconductor layer and the first interlayer insulating layer 161. For example, the third gate insulating layer 143 may overlap the channel 137 of the oxide transistor TFT, but may not overlap the first region 136 and the second region 138. The third gate insulating layer 143 may include an inorganic insulating material such as a silicon nitride ($SiN_x$), a silicon oxide ($SiO_x$), or a silicon oxynitride ($SiO_xN_y$).

A third gate conductive layer including the gate electrode 1155 of the oxide transistor TFT may be positioned on the third gate insulating layer 143. The gate electrode 1155 of the oxide transistor TFT may overlap the channel 137 of the semiconductor 135. The third gate conductive layer may have a single-layered or multi-layered structure. The third gate conductive layer may include a metal material such as molybdenum (Mo), aluminum (Al), copper (Cu), and/or titanium (Ti). For example, the third gate conductive layer may be formed in a form in which a layer made of titanium (Ti) and a layer made of molybdenum (Mo) are stacked.

After forming the third gate conductive layer, a doping process or plasma treatment can be performed. The part of the oxide semiconductor layer covered by the third gate conductive layer is not doped or plasma-treated and the part of the oxide semiconductor layer that is not covered by the third gate conductive layer is doped or plasma-treated, so the part of the oxide semiconductor layer that is not covered by the third gate conductive layer may have a predetermined conductivity. The doping process of the oxide semiconductor layer may be performed with an n-type dopant and the oxide transistor TFT including the oxide semiconductor layer may have an n-type transistor characteristic.

A second interlayer insulating layer 162 may be positioned on the third gate conductive layer including the gate electrode 1155 of the oxide transistor TFT. The second interlayer insulating layer 162 may have a single-layered or multi-layered structure. The second interlayer insulating layer 162 may include an inorganic insulating material such as a silicon nitride ($SiN_x$), a silicon oxide ($SiO_x$), or a silicon oxynitride ($SiO_xN_y$).

A first data conductive layer including a source electrode 173 and a drain electrode 175 of the polycrystalline transistor Poly TFT, and a source electrode 177 and a drain electrode 179 of the oxide transistor Oxide TFT may be positioned on the second interlayer insulating layer 162. The first data conductive layer may have a single-layered or multi-layered structure. The first data conductive layer may include aluminum (Al), platinum (Pt), palladium (Pd), silver (Ag), magnesium (Mg), gold (Au), nickel (Ni), neodymium (Nd), iridium (Jr), chromium (Cr), nickel (Ni), calcium (Ca), molybdenum (Mo), titanium (Ti), tungsten (W), and/or copper (Cu). The first data conductive layer may have a triple-layer structure of a lower layer including a refractory metal such as molybdenum, chromium, tantalum, and titanium or an alloy thereof, an intermediate film including an aluminum-based metal, a silver-based metal, and a copper-based metal with low resistivity, and an upper layer including a refractory metal such as molybdenum chromium, tantalum, and titanium.

The second interlayer insulating layer 162, the third gate insulating layer 143, the first interlayer insulating layer 161, the second gate insulating layer 142, and the first gate insulating layer 141 may include an opening exposing the source electrode 173 of the polycrystalline transistor Poly TFT and the first region 131 of the semiconductor 130. The source electrode 173 of the polycrystalline transistor Poly TFT may be connected to the first region 131 of the semiconductor 130 through the opening. Also, the second interlayer insulating layer 162, the third gate insulating layer 143, the first interlayer insulating layer 161, the second gate insulating layer 142, and the first gate insulating layer 141 may include an opening overlapping the drain electrode 175 of the polycrystalline transistor Poly TFT and the second region 133 of the semiconductor 130. The drain electrode 175 of the polycrystalline transistor Poly TFT may be connected to the second region 133 of the semiconductor 130 through the opening. Accordingly, the semiconductor 130, the gate electrode 1151, the source electrode 173, and the drain electrode 175 described above may constitute the polycrystalline transistor Poly TFT. According to an embodiment, the polycrystalline transistor Poly TFT may include only the first region 131 and the second region 133 of the semiconductor 130 instead of the source electrode 173 and the drain electrode 175.

The second interlayer insulating layer 162 and the third gate insulating layer 143 may include an opening exposing the source electrode 177 of the oxide transistor TFT and the first region 136 of the semiconductor 135. The source electrode 177 of the oxide transistor TFT may be connected to the first region 136 of the semiconductor 135 through the opening. Also, the second interlayer insulating layer 162 and the third gate insulating layer 143 may include an opening overlapping the drain electrode 179 of the oxide transistor TFT and the second region 138 of the semiconductor 135. The drain electrode 179 of the oxide transistor TFT may be connected to the second region 138 of the semiconductor 135 through the opening. Accordingly, the semiconductor 135, the gate electrode 1155, the source electrode 177, and the drain electrode 179 described above may constitute the oxide transistor TFT. According to an embodiment, the oxide transistor TFT may include only the first region 136 and the second region 138 of the semiconductor 135 instead of the source electrode 177 and the drain electrode 179.

A first passivation layer 180 may be positioned on the first data conductive layer including the source electrode 173 and the drain electrode 175 of the polycrystalline transistor Poly TFT, and the source electrode 177 and the drain electrode 179 of the oxide transistor TFT. The first passivation layer 180 may include an organic insulating material such as a general purpose polymer such as poly(methyl methacrylate) or polystyrene, a polymer derivative having a phenolic group, an acryl-based polymer, an imide polymer, a polyimide, an acryl-based polymer, and a siloxane-based polymer.

A second data conductive layer including a connection electrode 185, a data line 171, and a driving voltage line 172 may be positioned on the first passivation layer 180. The second data conductor may have a single-layered or multi-layered structure. The second data conductor may include aluminum (Al), platinum (Pt), palladium (Pd), silver (Ag), magnesium (Mg), gold (Au), nickel (Ni), neodymium (Nd), iridium (Jr), chromium (Cr)), nickel (Ni), calcium (Ca), molybdenum (Mo), titanium (Ti), tungsten (W), and/or copper (Cu). The second data conductive layer may have a triple-layered structure of a lower layer including refractory metals such as molybdenum, chromium, tantalum, and titanium, or their alloys, an intermediate layer including aluminum-based metals, silver-based metals, and copper-based materials with low resistivity, and an upper layer including a refractory metal such as molybdenum, chromium, tantalum, and titanium.

The first passivation layer 180 may include an opening exposing the connection electrode 185 connected to the drain electrode 175 of the polycrystalline transistor Poly TFT. The connection electrode 185 may be connected to the drain electrode 175 of the polycrystalline transistor Poly TFT through the opening.

A second passivation layer 182 may be positioned on the second data conductive layer including the connection electrode 185, the data line 171, and the driving voltage line 172. The second passivation layer 182 may include an organic insulating material such as a general purpose polymer such as poly(methyl methacrylate) or polystyrene, a polymer derivative having a phenolic group, an acryl-based polymer, an imide polymer, a polyimide, an acryl-based polymer, and a siloxane-based polymer.

The light-emitting element ED may be positioned on the second passivation layer 182. The light-emitting element ED may be connected to a polycrystalline transistor Poly TFT. The light-emitting element ED may include a pixel electrode 191, an emission layer 370, and a common electrode 270.

The pixel electrode 191 may be positioned on the second passivation layer 182. The second passivation layer 182 may include an opening 181 exposing the pixel electrode 191 which is connected to the connection electrode 185. The pixel electrode 191 may be connected to the connection electrode 185 through the opening 181. Accordingly, the pixel electrode 191 may be connected to the drain electrode 175 of the polycrystalline transistor Poly TFT through the connection electrode 185.

A bank layer 350 may be positioned on the pixel electrode 191.

The bank layer 350 is also referred to as a pixel defining layer (PDL), and includes a pixel opening 351 overlapping at least a portion of the pixel electrode 191. In this case, the pixel opening 351 may expose the central portion of the pixel electrode 191 and may not expose the edge portion of the pixel electrode 191. Accordingly, the size of the pixel opening 351 may be smaller than the size of the pixel electrode 191. The bank layer 350 may be an organic insulator including at least one material selected from the group consisting of polyimide, polyamide, acryl resin, benzocyclobutene, and phenol resin. According to an embodiment, the bank layer 350 may be formed as a black pixel defining layer (BPDL) including a black color pigment.

The pixel opening 351 may be a region in which the emission layer 370 may be disposed so that the emission layer 370 may be positioned on the portion where the upper surface of the pixel electrode 191 is exposed. The emission layer 370 may include a plurality of layers, some of the plurality of layers may be formed only within the pixel opening 351, and the remaining portions may be formed not only within the pixel opening 351 but also on the bank layer 350.

The common electrode 270 may be positioned on the emission layer 370. The common electrode 270 may be entirely positioned in most regions on the substrate 110. The common electrode 270 is also called a cathode, and may be formed of a transparent conductive layer including Indium Tin Oxide (ITO), Indium Zinc Oxide (IZO), Indium Gallium Zinc Oxide (IGZO), and Indium Tin Zinc Oxide (ITZO). In addition, the common electrode 270 may have a translucent characteristic, and in this case, it may constitute a microcavity together with the pixel electrode 191. According to the micro-cavity structure, light with a specific wavelength is emitted upwards by a gap and characteristics between both electrodes, and as a result red, green, or blue may be displayed.

The pixel electrode 191, the emission layer 370, and the common electrode 270 may form the light-emitting element ED together. In this case, the pixel electrode 191 may be an anode, and the common electrode 270 may be a cathode.

Although not shown, an encapsulation layer may be further positioned on the common electrode 270. The encapsulation layer is for protecting the light-emitting element ED from moisture or oxygen that may be inflowed from the outside, and may include at least one inorganic layer and at least one organic layer. For example, the encapsulation layer may have a shape in which a first inorganic encapsulation layer, an organic encapsulation layer, and a second inorganic encapsulation layer are stacked. However, this is only an example, and the number of inorganic and organic layers constituting the encapsulation layer may be variously changed.

The display device according to an embodiment may include a plurality of pixels, and each pixel may include a plurality of transistors and a light-emitting element connected thereto. Although one polycrystalline transistor Poly TFT and one oxide transistor Oxide TFT have been described above, each pixel may include a plurality of polycrystalline transistors Poly TFT and a plurality of oxide transistors TFT. Hereinafter, an example of a connection structure of a plurality of transistors included in one pixel is described with reference to FIG. 3.

Figure 3:
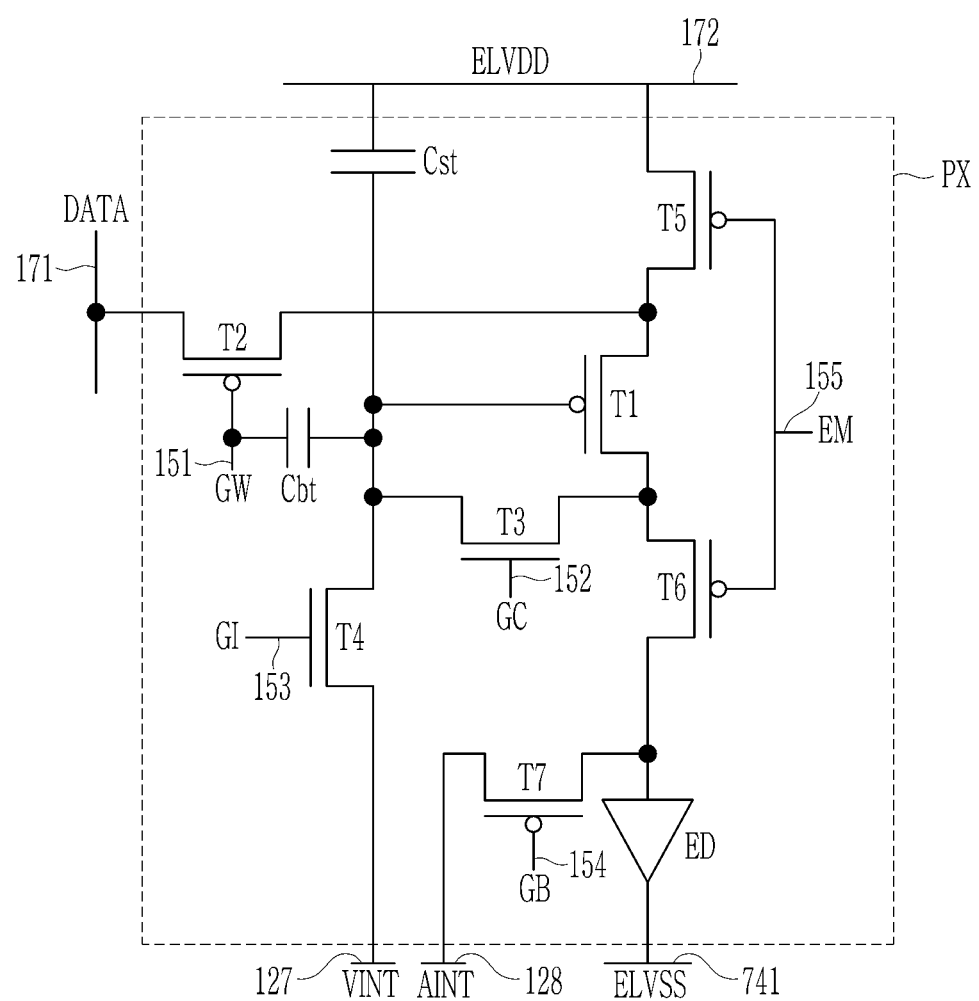
FIG. 3 is a circuit diagram of a display device according to an embodiment.

FIG. 3 is a circuit diagram of a display device according to an embodiment.

Figure 7:
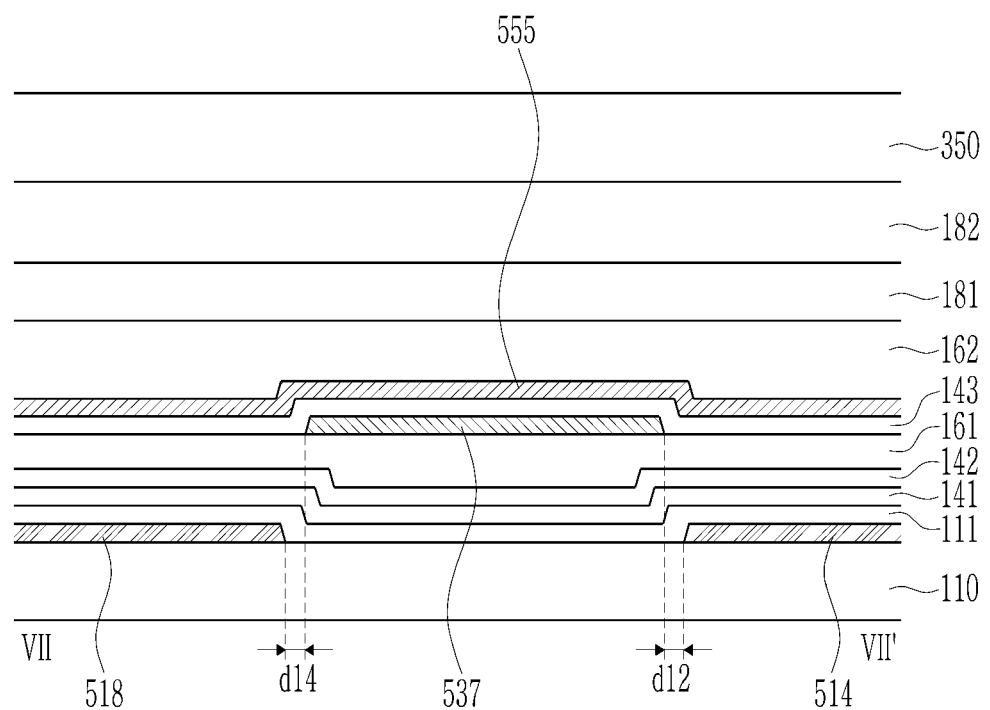
FIG. 7 is a cross-sectional view taken along a line VII-VII' of FIG. 5.

As shown in FIG. 7, one pixel PX of the display device according to an embodiment includes a plurality of transistors T1, T2, T3, T4, T5, T6, and T7 connected to several wires 127, 128, 151, 152, 153, 154, 155, 171, 172, and 741, a storage capacitor Cst, a boost capacitor Cbt, and a light-emitting element ED.

The plurality of wires 127, 128, 151, 152, 153, 154, 155, 171, 172, and 741 are connected to one pixel PX. The plurality of wires include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 transfers a first scan signal GW to the second transistor T2. A voltage of the opposite polarity to the voltage applied to the first scan signal line 151 may be applied to the second scan signal line 152 at the same timing as the signal of the first scan signal line 151. For example, when a negative voltage is applied to the first scan signal line 151, a positive voltage may be applied to the second scan signal line 152. The second scan signal line 152 transmits the second scan signal GC to the third transistor T3.

The initialization control line 153 transmits an initialization control signal GI to the fourth transistor T4. The bypass control line 154 transmits the bypass signal GB to the seventh transistor T7. The bypass control line 154 may transmit the first scan signal line 151 of the previous stage. The light emission control line 155 transmits the light emission control signal EM to the fifth transistor T5 and the sixth transistor T6.

The first scan signal line 151, the second scan signal line 152, the initialization control line 153, and the light emitting control line 155 receive the scan signal generated by the scan driver 20 and transmit it to each pixel. The scan driver 20 of the driving circuit may include a plurality of driving circuits. A plurality of driving circuits may include a driving circuit generating the first scan signal GW, a driving circuit generating the second scan signal GC, a driving circuit generating the initialization control signal GI, a driving circuit generating the light emitting control signal EM, and the like.

The data line 171 is a line that transmits a data voltage DATA generated by the data driver 50, and the luminance of light-emitting element ED is changed according to data voltage DATA applied to the pixel PX.

The driving voltage line 172 applies a driving voltage ELVDD. The first initialization voltage line 127 transmits the first initialization voltage VINT, and the second initialization voltage line 128 transmits the second initialization voltage AINT. The common voltage line 741 applies the common voltage ELVSS to the cathode of the light-emitting element ED. In the present embodiment, the voltages applied to the driving voltage line 172, the first and second initialization voltage lines 127 and 128, and the common voltage line 741 may be constant voltages, respectively.

Hereinafter, the structure and the connection relationship of a plurality of transistors are described in detail.

The driving transistor T1 may have a p-type transistor characteristic and may include a polycrystalline semiconductor. It is a transistor that adjusts the magnitude of the current output to the anode of the light-emitting element ED according to the data voltage DATA applied to the gate electrode of the driving transistor T1. Since the brightness of the light-emitting element ED is adjusted according to the magnitude of the driving current output to the anode of the light-emitting element ED, the luminance of the light-emitting element ED may be adjusted according to the data voltage DATA applied to the pixel PX. For this purpose, the first electrode of the driving transistor T1 receives the driving voltage ELVDD and is connected to the driving voltage line 172 via the fifth transistor T5. In addition, the first electrode of the driving transistor T1 is also connected to the second electrode of the second transistor T2 to receive the data voltage DATA. Meanwhile, the second electrode of the driving transistor T1 outputs the current toward the light-emitting element ED, and is connected to the anode of the light-emitting element ED via the sixth transistor T6. In addition, the second electrode of the driving transistor T1 transfers the data voltage DATA to the first electrode of the third transistor T3. Meanwhile, the gate electrode of the driving transistor T1 is connected to one electrode (hereinafter, referred to as 'a second storage electrode') of the storage capacitor Cst. Accordingly, the voltage of the gate electrode of the driving transistor T1 changes according to the voltage stored in the storage capacitor Cst, and accordingly, the driving current output by the driving transistor T1 is changed. In addition, the storage capacitor Cst also serves to keep the voltage of the gate electrode of the driving transistor T1 constant for one frame.

The second transistor T2 may have a p-type transistor characteristic and may include a polycrystalline semiconductor. The second transistor T2 is a transistor that transmits the data voltage DATA to the pixel PX. The gate electrode of the second transistor T2 is connected to the first scan signal line 151 and one electrode (hereinafter, referred to as 'a lower boost electrode') of the boost capacitor Cbt. The first electrode of the second transistor T2 is connected to the data line 171. The second electrode of the second transistor T2 is connected to the first electrode of the driving transistor T1. When the second transistor T2 is turned on by a negative voltage of the first scan signal GW transmitted through the first scan signal line 151, the data voltage DATA transmitted through the data line 171 is transmitted to the first electrode of the driving transistor T1.

The third transistor T3 may have an n-type transistor characteristic and may include an oxide semiconductor. The third transistor T3 electrically connects the second electrode of the driving transistor T1 and the gate electrode of the driving transistor T1. As a result, the third transistor T3 transmits a compensated data voltage which is compensated a threshold voltage of the driving transistor T1 to the second storage electrode of the storage capacitor Cst. The gate electrode of the third transistor T3 is connected to the second scan signal line 152 and the first electrode of the third transistor T3 is connected to the second electrode of the driving transistor T1. The second electrode of the third transistor T3 is connected to the second storage electrode of the storage capacitor Cst, and the gate electrode of the driving transistor T1 and the other electrode (hereinafter, referred to as 'an upper boost electrode') of the boost capacitor Cbt. The third transistor T3 is turned on by a positive voltage of the second scan signal GC transmitted through the second scan signal line 152, so that the gate electrode of the driving transistor T1 and the second electrode of the driving transistor T1 are connected and the voltage applied to the gate electrode of the driving transistor T1 is transmitted to the second storage electrode of the storage capacitor Cst to be stored in the storage capacitor Cst.

The fourth transistor T4 may have an n-type transistor characteristic and may include an oxide semiconductor. The fourth transistor T4 serves to initialize the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second storage electrode of the storage capacitor Cst, the gate electrode of the driving transistor T1, and the upper boost electrode. The fourth transistor T4 is turned on by a positive voltage of the initialization control signal GI transmitted through the initialization control line 153. The first initialization voltage VINT is transmitted to the gate electrode of the driving transistor T1 and the second storage electrode of the storage capacitor Cst through the fourth transistor T4 which is turned on. Accordingly, the voltage of the gate electrode of the driving transistor T1 and the storage capacitor Cst are initialized.

The fifth transistor T5 may have a p-type transistor characteristic and may include a polycrystalline semiconductor. The fifth transistor T5 serves to transmit the driving voltage ELVDD to the driving transistor T1. The gate electrode of the fifth transistor T5 is connected to the light emission control line 155, the first electrode of the fifth transistor T5 is connected to the driving voltage line 172 and the second electrode of the fifth transistor T5 is connected to the first electrode of the driving transistor T1.

The sixth transistor T6 may have a p-type transistor characteristic and may include a polycrystalline semiconductor. The sixth transistor T6 serves to transmit the driving current output from the driving transistor T1 to the light-emitting element ED. The gate electrode of the sixth transistor T6 is connected to the light emission control line 155, the first electrode of the sixth transistor T6 is connected to the second electrode of the driving transistor T1, and the second electrode of the sixth transistor T6 is connected to the anode of the light-emitting element ED.

The seventh transistor T7 may have a p-type transistor characteristic and may include a polycrystalline semiconductor. The seventh transistor T7 serves to initialize the anode of the light-emitting element LED. The gate electrode of the seventh transistor T7 is connected to the bypass control line 154, the first electrode of the seventh transistor T7 is connected to the anode of the light-emitting element LED, and the second electrode of the seventh transistor T7 is connected to the second initialization voltage line 128. If the seventh transistor T7 is turned on by a negative voltage of the bypass signal GB, the second initialization voltage AINT is applied to the anode of the light-emitting element LED to be initialized.

In the above, it has been described that one pixel PX includes seven transistors T1 to T7, one storage capacitor Cst, and one boost capacitor Cbt, but is not limited thereto, and the number of transistors and capacitors and their connection relationships may be changed in many ways.

In the present embodiment, the driving transistor T1 may include a polycrystalline semiconductor. Also, the third transistor T3 and the fourth transistor T4 may include an oxide semiconductor. The second transistor T2, the fifth transistor T5, the sixth transistor T6, and the seventh transistor T7 may include a polycrystalline semiconductor. That is, some transistors may be formed of polycrystalline transistors, and some of the remaining transistors may be formed of oxide transistors. However, the present inventive concept is not limited thereto, and at least one of the second transistor T2, the fifth transistor T5, the sixth transistor T6, and the seventh transistor T7 may include an oxide semiconductor. Also, all transistors may include a polycrystalline semiconductor. In the present embodiment, because the third transistor T3 and the fourth transistor T4 include a different semiconductor material from that of the driving transistor T1, it is possible to drive them more stably and improve reliability.

In the present embodiment, the driving transistor T1, the second transistor T2, the fifth transistor T5, the sixth transistor T6, and the seventh transistor T7 have been described as having the p-type transistor characteristic, and the third transistor T3 and the fourth transistor T4 have been described as having the n-type transistor characteristic, but the configuration of the transistors is not limited thereto. The type of each transistor may be altered, and the type of all transistors may be the same.

Hereinafter, the sensor ST of the display device according to an embodiment is described with reference to FIG. 4.

Figure 4:
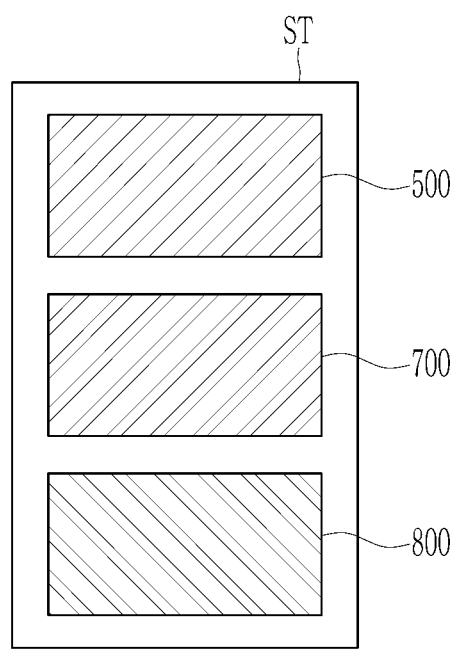
FIG. 4 is a view simply showing a sensor of a display device according to an embodiment.

FIG. 4 is a view schematically showing a sensor of a display device according to an embodiment.

As shown in FIG. 4, the sensor ST of the display device according to an embodiment may include a first sensor 500, a second sensor 700, and a third sensor 800.

The first sensor 500, the second sensor 700, and the third sensor 800 may each have a structure including a transistor and a conductive pattern partially overlapping the transistor, and the structure will be described later. The transistor and conductive pattern constituting the first sensor 500, the second sensor 700, and the third sensor 800 may include the same materials as the layers constituting each pixel PX positioned in the display area DA and may be positioned on the same layer. For example, the transistors of the first sensor 500, the second sensor 700, and the third sensor 800 may be formed by the oxide semiconductor layer and the third gate conductive layer. The conductive patterns of the first sensor 500, the second sensor 700, and the third sensor 800 may be positioned on different layers. For example, the conductive pattern of the first sensor 500 may be positioned on the same layer as the light blocking layer 122, the second sensor 700 may be positioned on the same layer as the first gate conductive layer, and the third sensor 800 may be positioned on the same layer as the second gate conductive layer.

Since the first sensor 500 includes the conductive pattern positioned on the same layer as the light blocking layer 122, a leakage current may occur when the light blocking layer 122 is misaligned by a predetermined range or more. That is, an off current of the transistor of the first sensor 500 increases when the misalignment of the light blocking layer 122 is occurred. Since the second sensor 700 includes the conductive pattern positioned on the same layer as the first gate conductive layer, a leakage current may occur when the first gate conductive layer is misaligned by a predetermined range or more. That is, the off current of the transistor of the second sensor 700 increases when the misalignment of the first gate conductive layer 1151 is occurred. Since the third sensor 800 includes the conductive pattern positioned on the same layer as the second gate conductive layer, a leakage current may occur when the second gate conductive layer is misaligned by a predetermined range or more. That is, the off current of the transistor of the third sensor 800 increases.

As described above, since the sensor ST is connected to the leakage current detecting circuit LCDC, the leakage current generated from the first sensor 500, the second sensor 700, and the third sensor 800 may be detected. When the leakage current detecting circuit LCDC detects the leakage current, the light-emitting element ED connected to the light emitting wiring EDL emits light. Through this, it may be determined whether or not the light blocking layer 122, the first gate conductive layer 1151, and the second gate conductive layer 1153 are misaligned.

Hereinafter, a planar and cross-sectional structure of the first sensor 500 of the sensors of the display device according to an embodiment is described with reference to FIG. 5 to FIG. 7.

Figure 5:
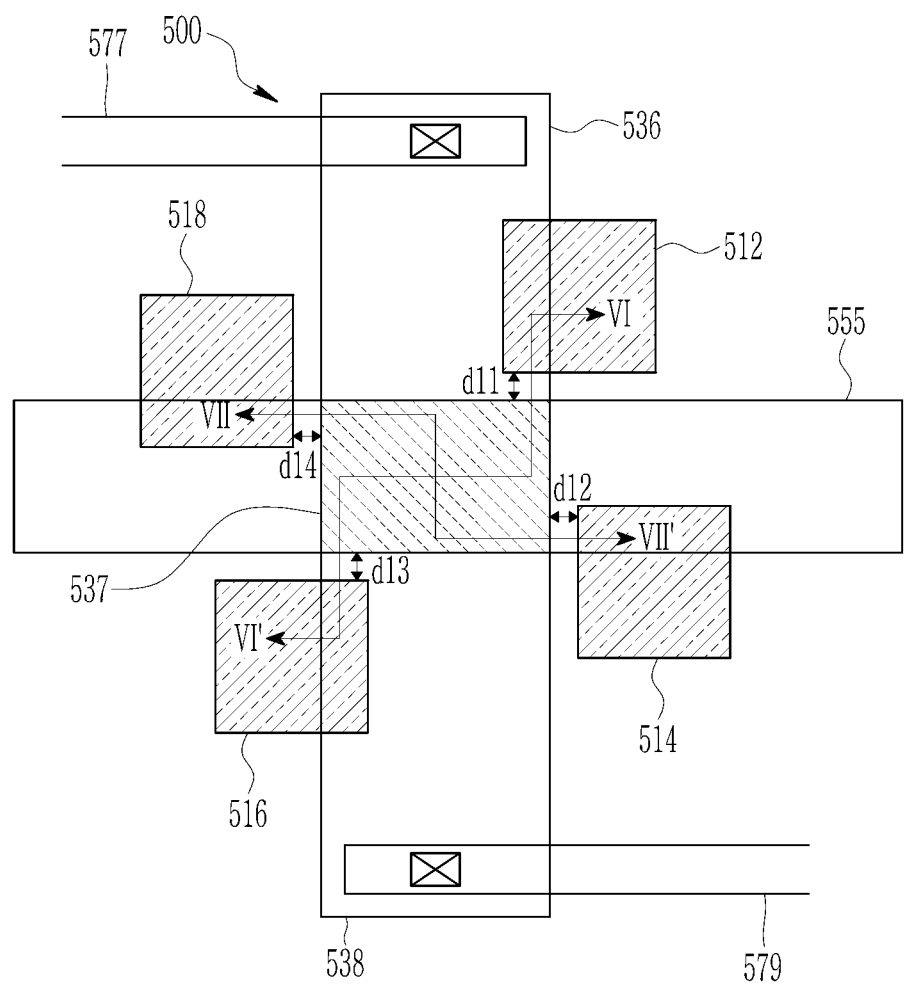
FIG. 5 is a top plan view showing a first sensor of a sensor of a display device according to an embodiment.
Figure 6:
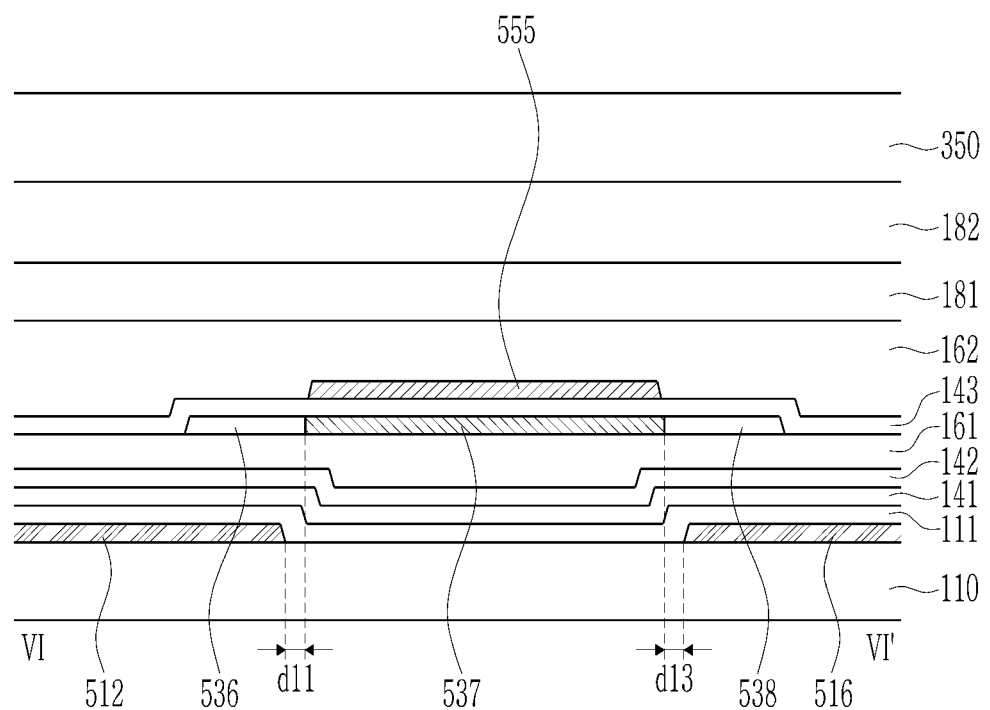
FIG. 6 is a cross-sectional view taken along a line VI-VI' of FIG. 5.

FIG. 5 is a top plan view showing a first sensor of a display device according to an embodiment, FIG. 6 is a cross-sectional view taken along a line VI-VI' of FIG. 5, and FIG. 7 is a cross-sectional view taken along a line VII-VII' of FIG. 5.

As shown in FIG. 5 to FIG. 7, a first sensor 500 of the display device according to an embodiment includes a first sensing transistor 510, and first conductive patterns 512, 514, 516, and 518 disposed to be spaced apart from the channel 537 of the semiconductor 535 of the first sensing transistor 510.

The first conductive patterns 512, 514, 516, and 518 may be positioned on the substrate 110. The first conductive patterns 512, 514, 516, and 518 may be positioned on the same layer as the light blocking layer 122. The first conductive patterns 512, 514, 516, and 518 may include the same material as the light blocking layer 122 and may be formed together through the same process. The first conductive patterns 512, 514, 516, and 518 are not electrically connected to the first sensing transistor 510. No predetermined voltage is applied to the first conductive patterns 512, 514, 516, and 518, and the first conductive patterns 512, 514, 516, and 518 are floated.

A buffer layer 111, a first gate insulating layer 141, a second gate insulating layer 142, and a first interlayer insulating layer 161 may be sequentially stacked on the first conductive patterns 512, 514, 516, and 518.

The first sensing transistor 510 may be positioned on the first interlayer insulating layer 161. The first sensing transistor 510 may include a semiconductor 535, a gate electrode 555 overlapping the semiconductor 535, and a source electrode 577 and a drain electrode 579 connected to the semiconductor 535.

The semiconductor 535 of the first sensing transistor 510 may be positioned on the same layer as the semiconductor 135 of the oxide transistor TFT. That is, the semiconductor 535 of the first sensing transistor 510 may be positioned in the same plane as the oxide semiconductor layer. The semiconductor 535 of the first sensing transistor 510 may include the same material as the semiconductor 135 of the oxide transistor TFT, and may be formed together with the semiconductor 135 of the oxide transistor TFT. The semiconductor 535 of the first sensing transistor 510 may include a first region 536, a channel 537, and a second region 538. The first region 536 and the second region 538 may be positioned on both sides of channel 537 of the semiconductor 535 of the first sensing transistor 510, respectively.

The third gate insulating layer 143 may be positioned on the semiconductor 535 of the first sensing transistor 510, and the gate electrode 555 of the first sensing transistor 510 may be positioned on the third gate insulating layer 143. The gate electrode 555 of the first sensing transistor 510 may be positioned on the same layer as the gate electrode 1155 of the oxide transistor TFT. That is, the gate electrode 555 of the first sensing transistor 510 may be positioned in the same plane as the third gate conductive layer. The gate electrode 555 of the first sensing transistor 510 may include the same material as the gate electrode 1155 of the oxide transistor TFT, and may be formed together with the gate electrode 1155 of the oxide transistor TFT. The gate electrode 555 of the first sensing transistor 510 may overlap the channel 537 of the semiconductor 535.

The second interlayer insulating layer 162 may be positioned on the gate electrode 555 of the first sensing transistor 510, and the source electrode 577 and the drain electrode 579 of the first sensing transistor 510 may be positioned on the second interlayer insulating layer 162. The source electrode 577 and the drain electrode 579 of the first sensing transistor 510 may be positioned on the same layer as the first data conductive layer.

The second interlayer insulating layer 162 and the third gate insulating layer 143 may include an opening exposing the first region 536 of the semiconductor 535. The source electrode 577 of the first sensing transistor 510 may be connected to the first region 536 of the semiconductor 535 through the opening. In addition, the second interlayer insulating layer 162 and the third gate insulating layer 143 may include an opening exposing the second region 538 of the semiconductor 535. The drain electrode 579 of the first sensing transistor 510 may be connected to the second region 538 of the semiconductor 535 through the opening. Accordingly, the semiconductor 535, the gate electrode 555, the source electrode 577, and the drain electrode 579 described above may constitute the first sensing transistor 510. According to an embodiment, the first sensing transistor 510 may include only the first region 536 and the second region 538 of the semiconductor 535 and may not include the source electrode 577 and the drain electrode 579. A first passivation layer 181 and a second passivation layer 182 may be sequentially stacked on the source electrode 577 and the drain electrode 579 of the first sensing transistor 510.

Next, the positional relationship between the first conductive patterns 512, 514, 516, and 518 and the channel 537 of the first sensing transistor 510 is described.

The first conductive patterns 512, 514, 516, and 518 may include a first upper conductive pattern 512, a first right conductive pattern 514, a first lower conductive pattern 516, and a first left conductive pattern 518. The first conductive patterns 512, 514, 516 and 518 may be positioned adjacent to the edge of the channel 537 of the first sensing transistor 510. The first conductive patterns 512, 514, 516, and 518 are spaced apart from the edge of the channel 537 of the first sensing transistor 510 at a predetermined distance. The channel 537 of the first sensing transistor 510 may have an approximately quadrangle shape in a plan view.

The first upper conductive pattern 512 may be disposed adjacent to the upper edge of the channel 537 of the first sensing transistor 510. The first upper conductive pattern 512 and the upper edge of the channel 537 of the first sensing transistor 510 are spaced apart from each other to have a first interval d11. The first upper conductive pattern 512 may overlap the semiconductor 535 of the first sensing transistor 510 and may not overlap the gate electrode 555. In this case, the first upper conductive pattern 512 may overlap the first region 536 of the semiconductor 535.

The first right conductive pattern 514 may be disposed adjacent to the right edge of the channel 537 of the first sensing transistor 510. The first right conductive pattern 514 and the right edge of the channel 537 of the first sensing transistor 510 are spaced apart from each other to have a second interval d12. The first right conductive pattern 514 may overlap the gate electrode 555 of the first sensing transistor 510 and may not overlap the semiconductor 535.

The first lower conductive pattern 516 may be disposed adjacent to the lower edge of the channel 537 of the first sensing transistor 510. The first lower conductive pattern 516 and the lower edge of the channel 537 of the first sensing transistor 510 are spaced apart from each other to have a third interval d13. The first lower conductive pattern 516 may overlap the semiconductor 535 of the first sensing transistor 510 and may not overlap the gate electrode 555. In this case, the first lower conductive pattern 516 may overlap the second region 538 of the semiconductor 535.

The first left conductive pattern 518 may be disposed adjacent to the left edge of the channel 537 of the first sensing transistor 510. The first left conductive pattern 518 and the left edge of the channel 537 of the first sensing transistor 510 are spaced apart from each other to have a fourth interval d14. The first left conductive pattern 518 may overlap the gate electrode 555 of the first sensing transistor 510 and may not overlap the semiconductor 535.

The distance between the first conductive patterns 512, 514, 516, and 518 and the channel 537 of the first sensing transistor 510 may be constant. That is, the first interval d11, the second interval d12, the third interval d13, and the fourth interval d14 may be substantially the same. However, even if the first interval d11, the second interval d12, the third interval d13, and the fourth interval d14 are designed identically, an error may occur in the process, so that at least some of the first interval d11, the second interval d12, the third interval d13, and the fourth interval d14 may be different.

Hereinafter, a case in which the first conductive pattern is formed differently from the designed one due to a mask misalignment or the like during the process is described with reference to FIG. 8 to FIG. 15.

Figure 8:
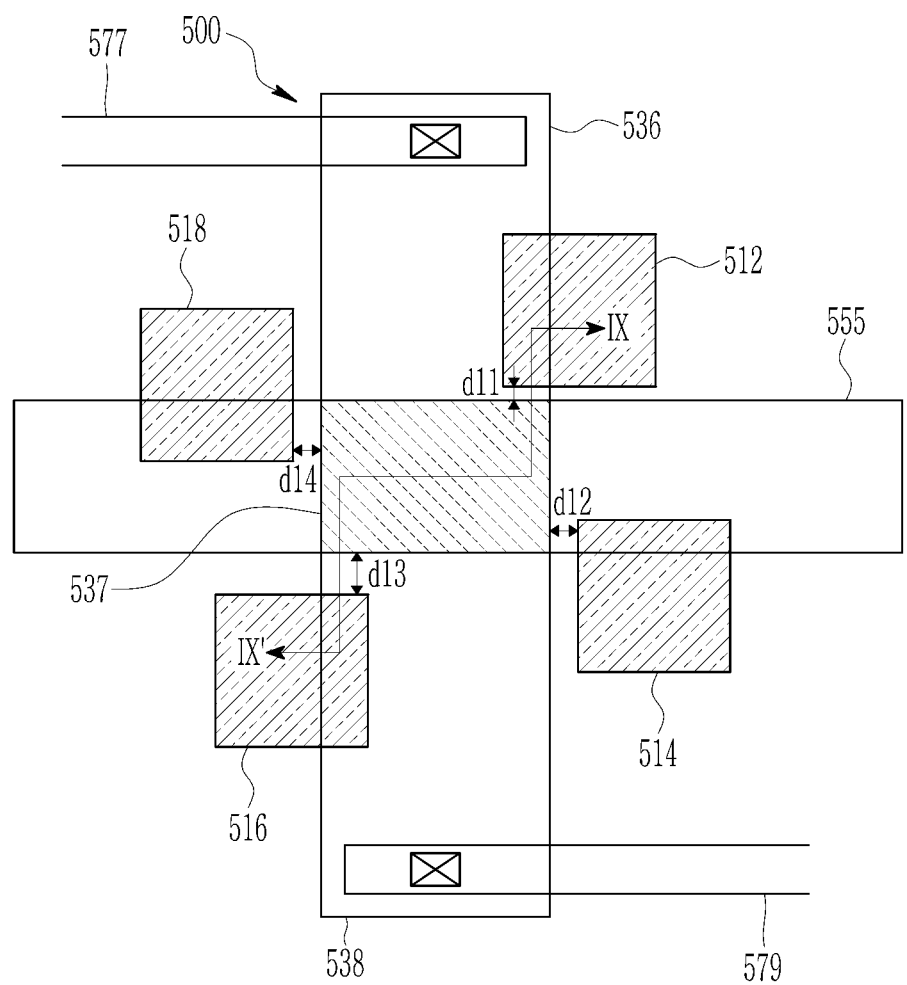
FIG. 8, FIG. 10, FIG. 12, and FIG. 14 are top plan views showing a first sensor of a sensor of a display device according to an embodiment.
Figure 9:
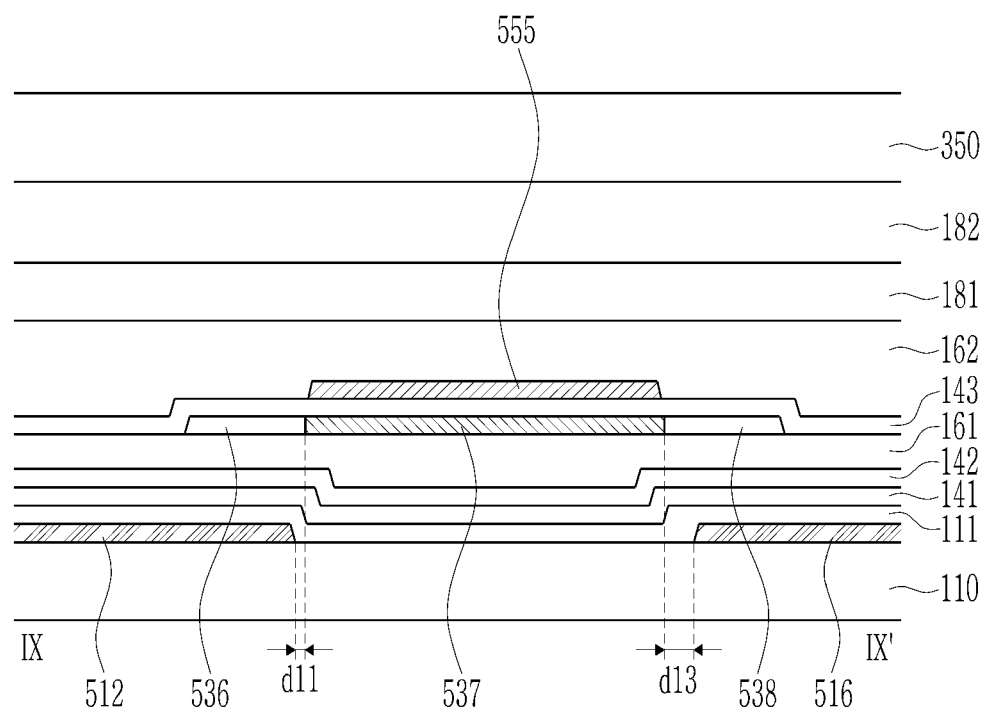
FIG. 9 is a cross-sectional view taken along a line IX-IX' of FIG. 8.
Figure 10:
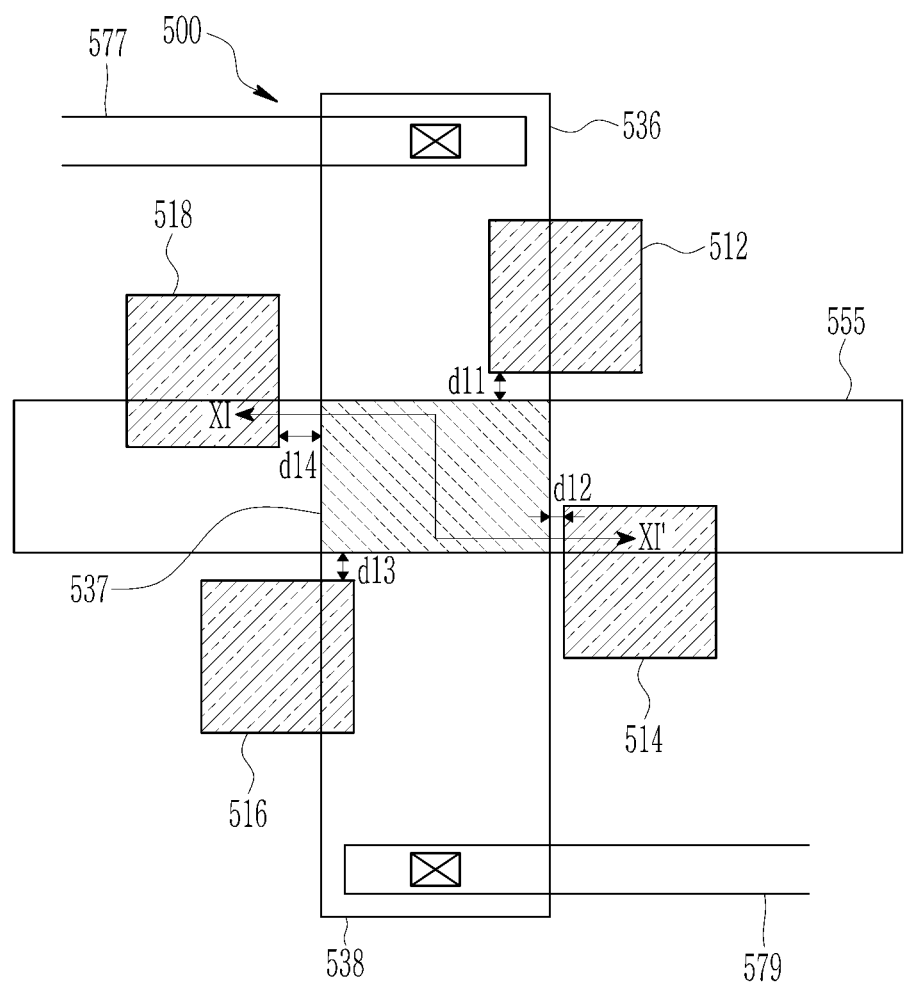
Figure 11:
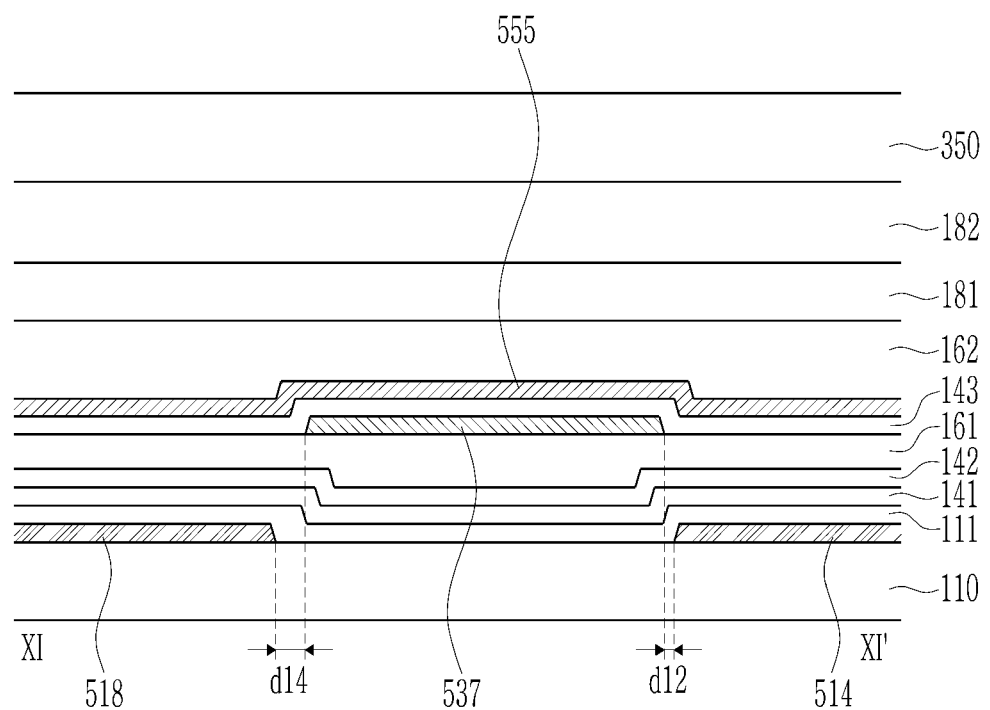
FIG. 11 is a cross-sectional view taken along a line XI-XI' of FIG. 10.
Figure 12:
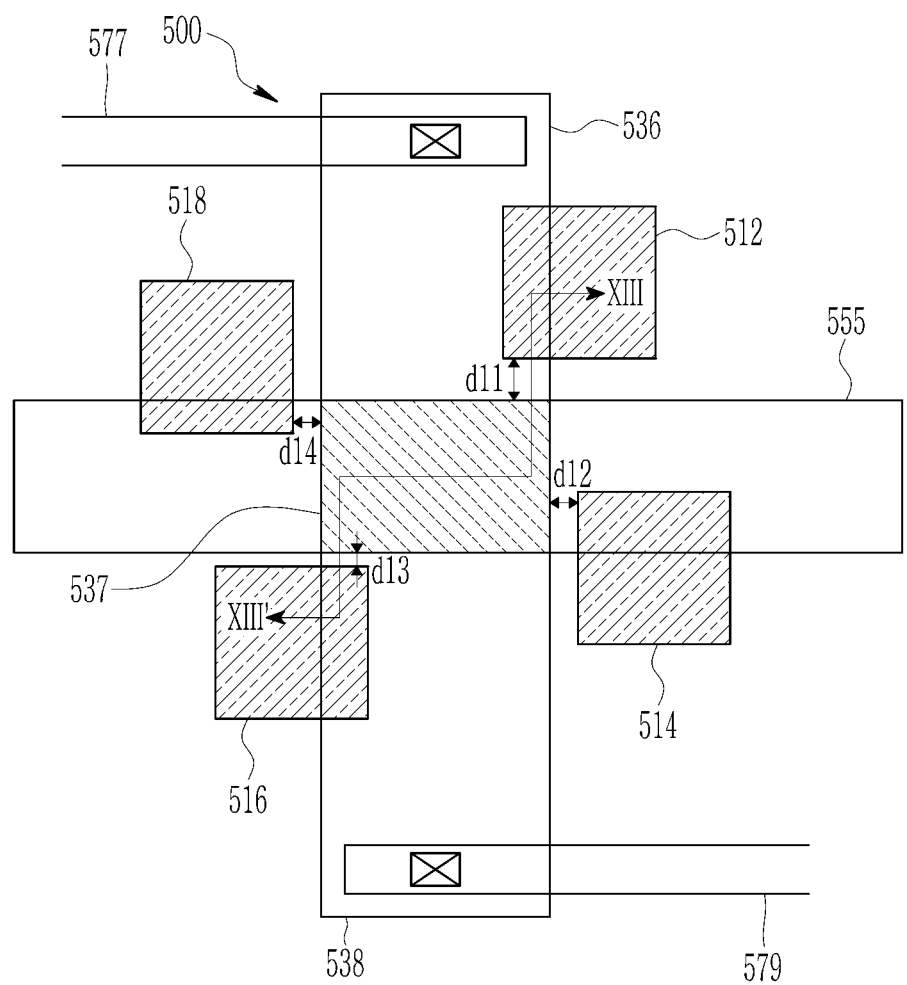
Figure 13:
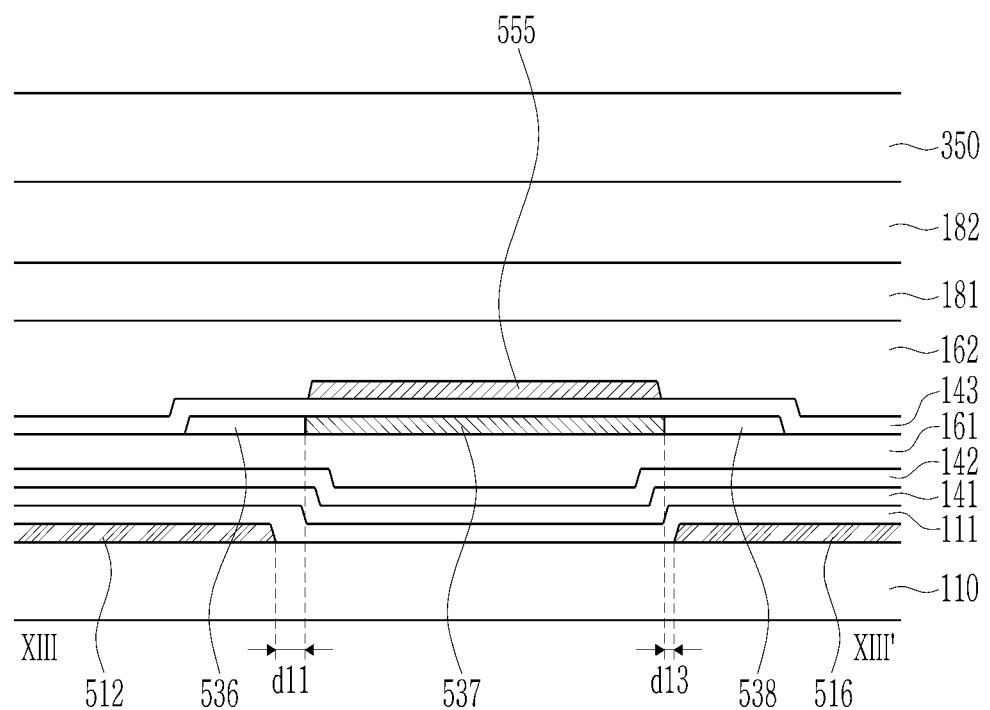
FIG. 13 is a cross-sectional view taken along a line XIII-XIII' of FIG. 12.
Figure 14:
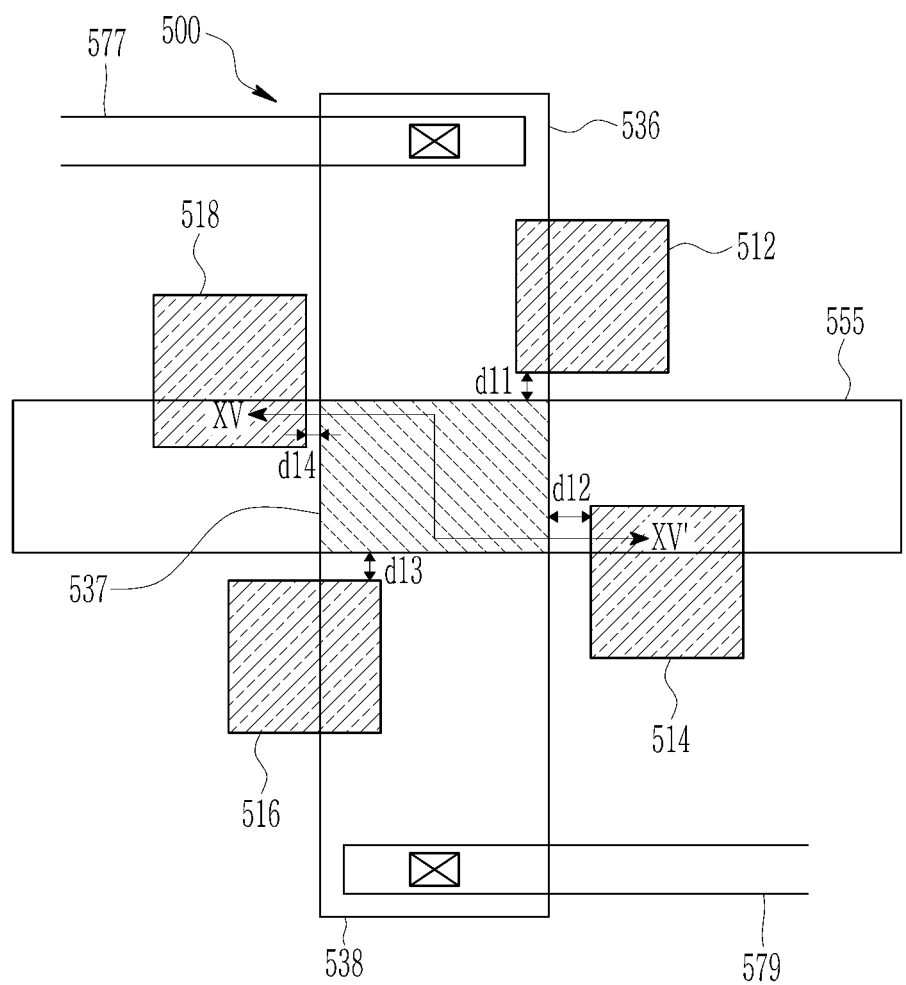
Figure 15:
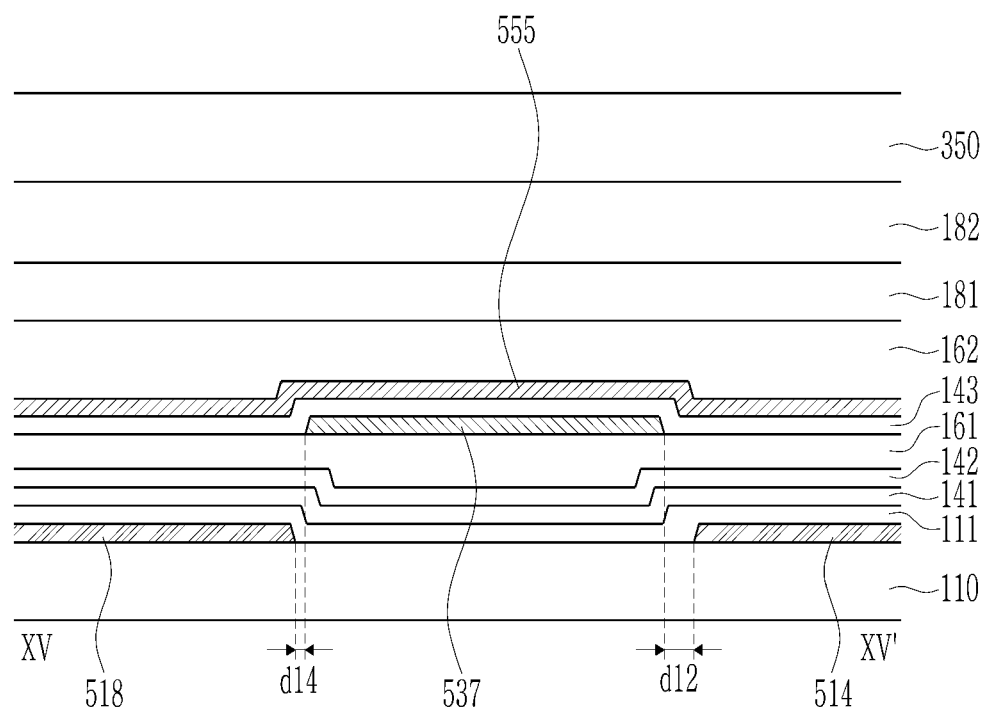
FIG. 15 is a cross-sectional view taken along a line XV-XV' of FIG. 14.

FIG. 8, FIG. 10, FIG. 12, and FIG. 14 are top plan views showing a first sensor of a display device according to an embodiment. FIG. 9 is a cross-sectional view taken along a line IX-IX' of FIG. 8, and FIG. 11 is a cross-sectional view taken along a line XI-XI' of FIG. 10. FIG. 13 is a cross-sectional view taken along a line XIII-XIII' of FIG. 12, and FIG. 15 is a cross-sectional view taken along a line XV-XV' of FIG. 14. FIG. 8 and FIG. 9 show a case in which the first conductive pattern is shifted downward in a plan view, and FIG. 10 and FIG. 11 show a case in which the first conductive pattern is shifted to the left in a plan view. FIG. 12 and FIG. 13 show a case in which the first conductive pattern is shifted upward in a plan view, and FIG. 14 and FIG. 15 show a case in which the first conductive pattern is shifted to the right in a plan view.

As shown in FIG. 8 and FIG. 9, If the first conductive patterns 512, 514, 516 and 518 are shifted downward in a plan view, the distance between the first upper conductive pattern 512 and the channel 537 of the first sensing transistor 510 is reduced. That is, the first interval d11 decreases and the third interval d13 increases. The second interval d12 and fourth interval d14 may be kept constant. When the distance between the first upper conductive pattern 512 and the channel 537 of the first sensing transistor 510 is reduced, a change may occur in the characteristic of the first sensing transistor 510.

As shown in FIG. 10 and FIG. 11, when the first conductive patterns 512, 514, 516, and 518 are shifted to the left in a plan view, the distance between the first right conductive pattern 514 and the channel 537 of the first sensing transistor 510 is reduced. That is, the second interval d12 decreases, and the fourth interval d14 increases. The first interval d11 and the third interval d13 may be kept constant. If the distance between the first right conductive pattern 514 and the channel 537 of the first sensing transistor 510 is reduced, a change may occur in the characteristic of the first sensing transistor 510.

As shown in FIG. 12 and FIG. 13, when the first conductive patterns 512, 514, 516, and 518 are shifted upward in in a plan view, the distance between the first lower conductive pattern 516 and the channel 537 of the first sensing transistor 510 is reduced. That is, the third interval d13 decreases, and the first interval d11 increases. The second interval d12 and fourth interval d14 may be kept constant. When the distance between the first lower conductive pattern 516 and the channel 537 of the first sensing transistor 510 is reduced, a change may occur in the characteristic of the first sensing transistor 510.

As shown in FIG. 14 and FIG. 15, if the first conductive patterns 512, 514, 516, and 518 are shifted to the right in a plan view, the distance between the first left conductive pattern 518 and the channel 537 of the first sensing transistor 510 is reduced. That is, the fourth interval d14 decreases, and the second interval d12 increases. The first interval d11 and the third interval d13 may be kept constant. If the distance between the first left conductive pattern 518 and the channel 537 of the first sensing transistor 510 is reduced, a change may occur in the characteristic of the first sensing transistor 510.

In this way, when the shift of the first conductive patterns 512, 514, 516, and 518 occurs, the same effect as when a foreign object is generated under the channel 537 of the first sensing transistor 510 may occur. For example, the leakage current may occur in the first sensing transistor 510. When the leakage current occurs in the first sensing transistor 510, the leakage current detecting circuit LCDC connected to the sensor ST may detect the leakage current, and the light-emitting element ED connected to the light emitting wiring EDL may emit light. The first conductive patterns 512, 514, 516, and 518 may be positioned on the same layer as the light blocking layer 122, and may be formed using the same mask. Therefore, when the light blocking layer 122 is shifted due to a mask misalignment, the leakage current detecting circuit LCDC detects the leakage current and a band-shaped light emitting pattern may appear in the display area DA. Leakage current due to the lower shift of the light blocking layer 122 may be mainly influenced by the first upper conductive pattern 512, and leakage current due to the left shift of the light blocking layer 122 may be mainly influenced by the first right conductive pattern 514. Leakage current due to the upper shift of the light blocking layer 122 may be mainly influenced by the first lower conductive pattern 516, and leakage current due to the right shift of the light blocking layer 122 may be mainly influenced by the first left conductive pattern 518.

Next, the planar and cross-sectional structure of the second sensor 700 of the display device according to an embodiment is described with reference to FIG. 16 and FIG. 17.

Figure 16:
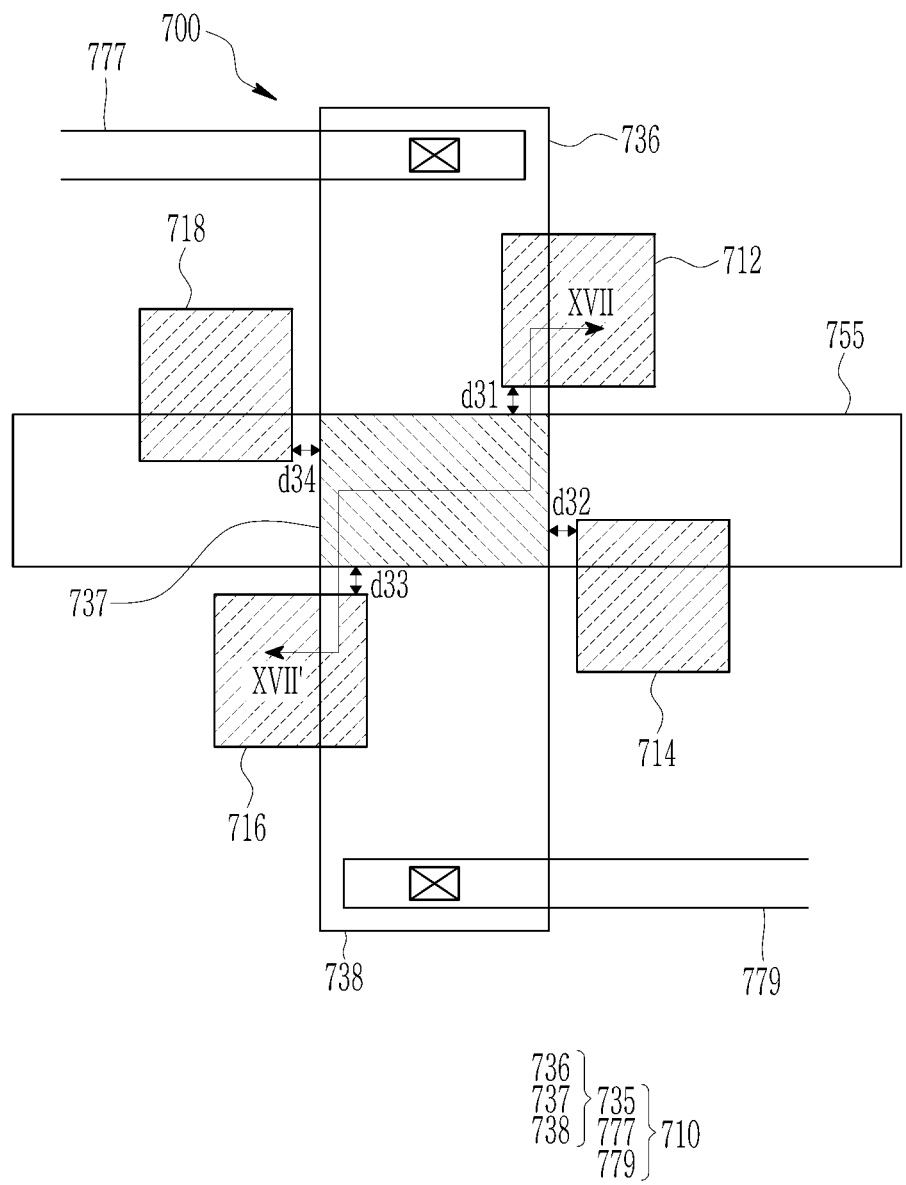
FIG. 16 is a top plan view showing a second sensor of a sensor of a display device according to an embodiment.
Figure 17:
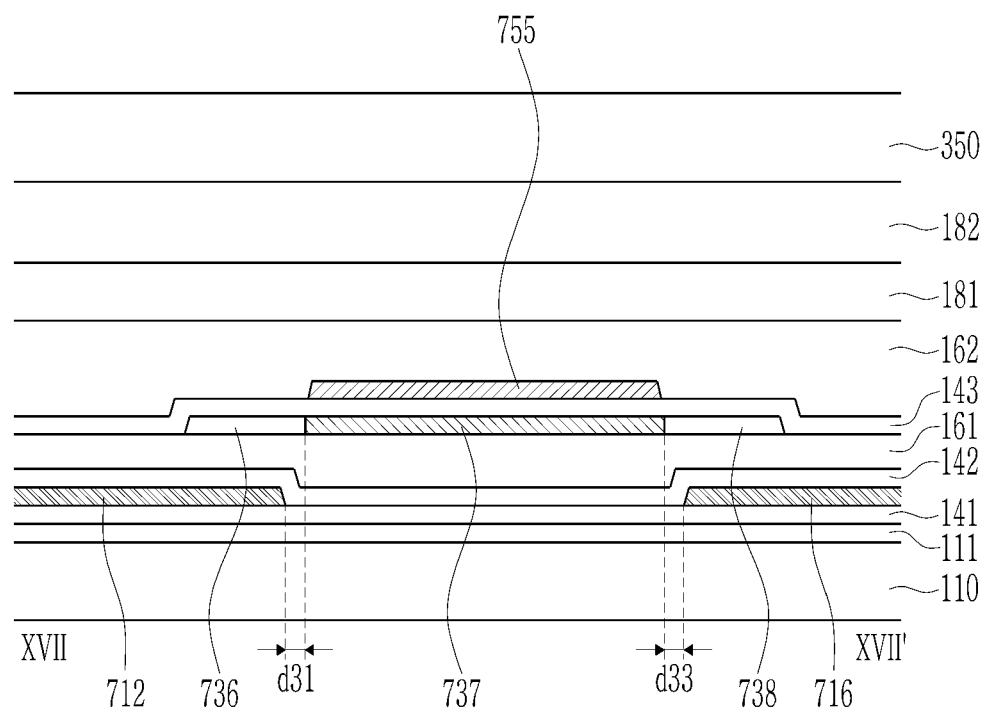
FIG. 17 is a cross-sectional view taken along a line XVII-XVII' of FIG. 16.

FIG. 16 is a top plan view showing a second sensor of a display device according to an embodiment, and FIG. 17 is a cross-sectional view taken along a line XVII-XVII' of FIG. 16.

As shown in FIG. 16 and FIG. 17, a second sensor 700 of the display device according to an embodiment includes a second sensing transistor 710, and second conductive patterns 712, 714, 716, and 718 separated from the channel 737 of the semiconductor 735 of the second sensing transistor 710.

The buffer layer 111 and the first gate insulating layer 141 may be positioned on the substrate 110, and the second conductive patterns 712, 714, 716, and 718 may be positioned on the first gate insulating layer 141. The second conductive patterns 712, 714, 716, and 718 may be positioned on the same layer as gate electrode 1151 of the polycrystalline transistor Poly TFT. That is, the second conductive patterns 712, 714, 716, and 718 may be positioned in the same plane as the first gate conductive layer. The second conductive patterns 712, 714, 716, and 718 are not electrically connected to the second sensing transistor 710. No predetermined voltage is applied to the second conductive patterns 712, 714, 716, and 718, and the second conductive patterns 712, 714, 716, and 718 are floated.

The second gate insulating layer 142 and the first interlayer insulating layer 161 may be positioned on the second conductive patterns 712, 714, 716, and 718, and the second sensing transistor 710 may be positioned on the first interlayer insulating layer 161. The second sensing transistor 710 may include a semiconductor 735, a gate electrode 755 overlapping the semiconductor 735, and a source electrode 777 and a drain electrode 779 connected to the semiconductor 735.

The semiconductor 735 of the second sensing transistor 710 can be positioned on the same layer as the semiconductor 135 of the oxide transistor TFT. That is, the semiconductor 735 of the second sensing transistor 710 can be positioned in the same plane as the oxide semiconductor layer. The semiconductor 735 of the second sensing transistor 710 may include the same material as the semiconductor 135 of the oxide transistor TFT, and may be formed together in the same process. The semiconductor 735 of the second sensing transistor 710 may include a first region 736, a channel 737, and a second region 738. The first region 736 and the second region 738 may be positioned on both sides of channel 737 of the semiconductor 735 of the second sensing transistor 710, respectively.

The third gate insulating layer 143 may be positioned on the semiconductor 735 of the second sensing transistor 710, and the gate electrode 755 of the second sensing transistor 710 may be positioned on the third gate insulating layer 143. The gate electrode 755 of the second sensing transistor 710 may be positioned on the same layer as the gate electrode 1155 of the oxide transistor TFT. That is, the gate electrode 755 of the second sensing transistor 710 may be positioned in the same plane as the third gate conductive layer. The gate electrode 755 of the second sensing transistor 710 may include the same material as the gate electrode 755 of the oxide transistor TFT, and may be formed together in the same process. The gate electrode 755 of the second sensing transistor 710 may overlap the channel 737 of the semiconductor 735.

The second interlayer insulating layer 162 may be positioned on the gate electrode 755 of the second sensing transistor 710, and the source electrode 777 and the drain electrode 779 of the second sensing transistor 710 may be positioned on the second interlayer insulating layer 162. The source electrode 777 and drain electrode 779 of the second sensing transistor 710 may be positioned in the same layer as the first data conductive layer.

The second interlayer insulating layer 162 and the third gate insulating layer 143 may include an opening exposing the first region 736 of the semiconductor 735. The source electrode 777 of the second sensing transistor 710 can be connected to the first region 736 of the semiconductor 735 through the opening. In addition, the second interlayer insulating layer 162 and the third gate insulating layer 143 may include an opening exposing the second region 738 of the semiconductor 735. The drain electrode 779 of the second sensing transistor 710 may be connected to the second region 738 of the semiconductor 735 through the opening. Accordingly, the aforementioned semiconductor 735, the gate electrode 755, the source electrode 777, and the drain electrode 779 may constitute the second sensing transistor 710. According to an embodiment, the second sensing transistor 710 may include only the first region 736 and the second region 738 of the semiconductor 735 and may not include the source electrode 777 and the drain electrode 779. The first passivation layer 181 and the second passivation layer 182 may be sequentially stacked on the source electrode 777 and the drain electrode 779 of the second sensing transistor 710.

Next, the positional relationship between the second conductive patterns 712, 714, 716, and 718 and the channel 737 of the second sensing transistor 710 is described.

The second conductive patterns 712, 714, 716, and 718 may include a first upper conductive pattern 712, a first right conductive pattern 714, a first lower conductive pattern 716, and a first left conductive pattern 718. The second conductive patterns 712, 714, 716, and 718 may be positioned adjacent to the edge of channel 737 of the second sensing transistor 710. The second conductive patterns 712, 714, 716, and 718 are spaced apart from the edge of the channel 737 of the second sensing transistor 710 at a predetermined interval. The channel 737 of the second sensing transistor 710 may be approximately quadrangular in a plan view.

The first upper conductive pattern 712 may be disposed adjacent to the upper edge of the channel 737 of the second sensing transistor 710. The first upper conductive pattern 712 and the upper edge of the channel 737 of the second sensing transistor 710 are spaced apart from each other to have a first interval d31. The first upper conductive pattern 712 may overlap the semiconductor 735 of the second sensing transistor 710 and may not overlap the gate electrode 755. In this case, the first upper conductive pattern 712 may overlap the first region 736 of the semiconductor 735.

The first right conductive pattern 714 may be disposed adjacent to the right edge of the channel 737 of the second sensing transistor 710. The first right conductive pattern 714 and the right edge of the channel 737 of the second sensing transistor 710 are spaced apart from each other to have a second interval d32. The first right conductive pattern 714 may overlap the gate electrode 755 of the second sensing transistor 710 and may not overlap the semiconductor 735.

The first lower conductive pattern 716 may be disposed adjacent to the lower edge of the channel 737 of the second sensing transistor 710. The first lower conductive pattern 716 and the lower edge of the channel 737 of the second sensing transistor 710 are spaced apart from each other to have a third interval d33. The first lower conductive pattern 716 may overlap the semiconductor 735 of the second sensing transistor 710 and may not overlap the gate electrode 755. In this case, the first lower conductive pattern 716 may overlap the second region 738 of the semiconductor 735.

The first left conductive pattern 718 may be disposed adjacent to the left edge of the channel 737 of the second sensing transistor 710. The first left conductive pattern 718 and the left edge of the channel 737 of the second sensing transistor 710 are spaced apart from each other to have a fourth interval d34. The first left conductive pattern 718 may overlap the gate electrode 755 of the second sensing transistor 710 and may not overlap the semiconductor 735.

The distance between the second conductive patterns 712, 714, 716, and 718 and the channel 737 of the second sensing transistor 710 may be constant. That is, the first interval d31, the second interval d32, the third interval d33, and the fourth interval d34 may be substantially the same. However, even if the first interval d31, the second interval d32, the third interval d33, and the fourth interval d34 are designed identically, an error may occur in the process, so that at least some of the first interval d31, the second interval d32, the third interval d33, and the fourth interval d34 may be different.

When the shift occurs in the second conductive patterns 712, 714, 716, and 718, the same effect as when a foreign object is generated under the channel 737 of the second sensing transistor 710 may occur. For example, the leakage current may occur in the second sensing transistor 710. When a leakage current occurs in the second sensing transistor 710, the leakage current detecting circuit LCDC connected to the sensor ST may detect the leakage current, and the light-emitting element ED connected to the light emitting wiring EDL may emit light. The second conductive patterns 712, 714, 716, and 718 can be positioned on the same layer as the gate electrode 1151 of the polycrystalline transistor Poly TFT, and may be formed using the same mask. Therefore, when the gate electrode 1151 of the polycrystalline transistor Poly TFT is shifted due to the mask misalignment, the leakage current detecting circuit LCDC detects the leakage current and a band-shaped light emitting pattern may appear in the display area DA. Leakage current due to the lower shift of the gate electrode 1151 of the polycrystalline transistor Poly TFT may be mainly influenced by the first upper conductive pattern 712, and leakage current due to the left shift of the gate electrode 1151 of the polycrystalline transistor Poly TFT may be mainly influenced by the first right conductive pattern 714. Leakage current due to the upper shift of the gate electrode 1151 of the polycrystalline transistor Poly TFT may be mainly influenced by the first lower conductive pattern 716, and leakage current due to the right shift of the gate electrode 1151 of the polycrystalline transistor Poly TFT may be mainly influenced by the first left conductive pattern 718.

Hereinafter, planar and cross-sectional structures of the third sensor 800 of the display device according to an embodiment is described with reference to FIG. 18 and FIG. 19.

Figure 18:
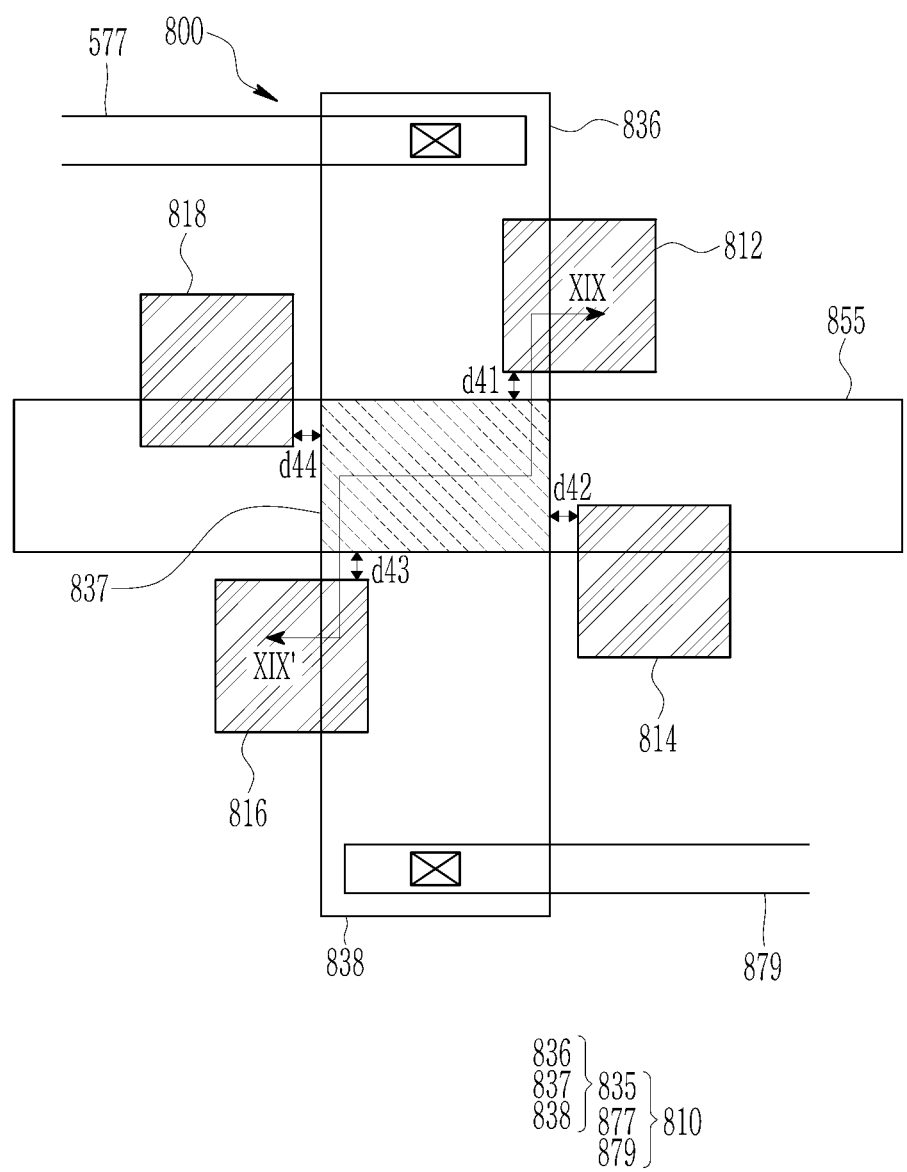
FIG. 18 is a top plan view showing a third sensor of a sensor of a display device according to an embodiment.
Figure 19:
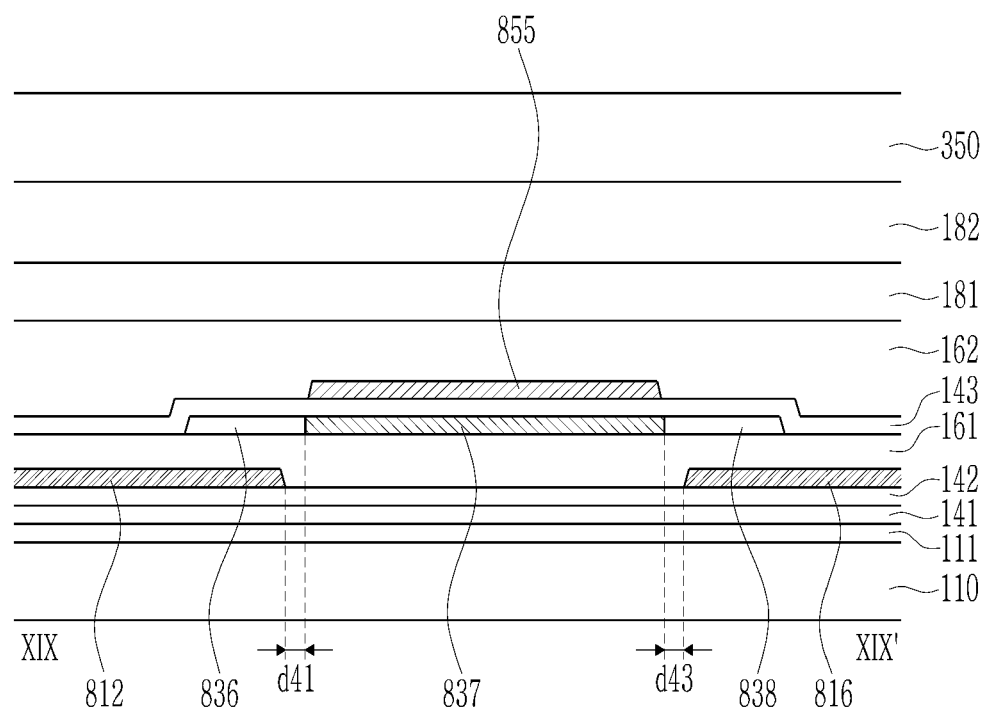
FIG. 19 is a cross-sectional view taken along a line XIX-XIX' of FIG. 18.

FIG. 18 is a top plan view showing a third sensor of a sensor of a display device according to an embodiment, and FIG. 19 is a cross-sectional view taken along a line XIX-XIX' of FIG. 18.

As shown in FIG. 18 and FIG. 19, the third sensor 800 of the display device according to an embodiment includes a third sensing transistor 810, and third conductive patterns 812, 814, 816, and 818 spaced apart from the channel 837 of the semiconductor 835 of the third sensing transistor 810.

The buffer layer 111 and the first gate insulating layer 141 can be positioned on the substrate 110, and the third conductive patterns 812, 814, 816, and 818 can be positioned on the first gate insulating layer 141. The third conductive patterns 812, 814, 816, and 818 can be positioned on the same layer as the gate electrode 1151 of the polycrystalline transistor Poly TFT. That is, the third conductive patterns 812, 814, 816, and 818 can be positioned in the same plane as the first gate conductive layer. The third conductive patterns 812, 814, 816, and 818 are not electrically connected to the third sensing transistor 810. No predetermined voltage is applied to the third conductive patterns 812, 814, 816, and 818, and the third conductive patterns 812, 814, 816, and 818 are floated.

The second gate insulating layer 142 and the first interlayer insulating layer 161 may be positioned on the third conductive patterns 812, 814, 816, and 818, and the third sensing transistor 810 may be positioned on the first interlayer insulating layer 161. The third sensing transistor 810 may include a semiconductor 835, a gate electrode 855 overlapping the semiconductor 835, and a source electrode 877 and a drain electrode 879 connected to the semiconductor 835.

The semiconductor 835 of the third sensing transistor 810 may be positioned on the same layer as the semiconductor 135 of the oxide transistor TFT. That is, the semiconductor 835 of the third sensing transistor 810 may be positioned in the same plane as the oxide semiconductor layer. The semiconductor 835 of the third sensing transistor 810 can contain the same material as the semiconductor 135 of the oxide transistor TFT, and may be formed together in the same process. The semiconductor 835 of the third sensing transistor 810 may include a first region 836, a channel 837, and a second region 838. The first region 836 and the second region 838 may be positioned on both sides of the channel 837 of the semiconductor 835 of the third sensing transistor 810, respectively.

The third gate insulating layer 143 may be positioned on the semiconductor 835 of the third sensing transistor 810, and the gate electrode 855 of the third sensing transistor 810 may be positioned on the third gate insulating layer 143. The gate electrode 855 of the third sensing transistor 810 may be positioned on the same layer as the gate electrode 1155 of the oxide transistor TFT. That is, the gate electrode 855 of the third sensing transistor 810 may be positioned in the same plane as the third gate conductive layer. The gate electrode 855 of the third sensing transistor 810 may include the same material as the gate electrode 855 of the oxide transistor TFT, and may be formed together in the same process. The gate electrode 855 of the third sensing transistor 810 may overlap the channel 837 of the semiconductor 835.

The second interlayer insulating layer 162 may be positioned on the gate electrode 855 of the third sensing transistor 810, and the source electrode 877 and the drain electrode 879 of the third sensing transistor 810 may be positioned on the second interlayer insulating layer 162. The source electrode 877 and the drain electrode 879 of the third sensing transistor 810 may be positioned in the same plane as the first data conductive layer.

The second interlayer insulating layer 162 and the third gate insulating layer 143 may include an opening exposing the first region 836 of the semiconductor 835. The source electrode 877 of the third sensing transistor 810 may be connected to the first region 836 of the semiconductor 835 through the opening. In addition, the second interlayer insulating layer 162 and the third gate insulating layer 143 may include an opening exposing the second region 838 of the semiconductor 835. The drain electrode 879 of the third sensing transistor 810 may be connected to the second region 838 of the semiconductor 835 through the opening. Accordingly, the semiconductor 835, the gate electrode 855, the source electrode 877, and the drain electrode 879 described above may constitute the third sensing transistor 810. According to an embodiment, the third sensing transistor 810 may include only the first region 836 and the second region 838 of the semiconductor 835 and may not include the source electrode 877 and drain electrode 879. The first passivation layer 181 and the second passivation layer 182 may be sequentially stacked on the source electrode 877 and the drain electrode 879 of the third sensing transistor 810.

Next, the position relationship between third conductive patterns 812, 814, 816, and 818 and the channel 837 of the third sensing transistor 810 is described.

The third conductive patterns 812, 814, 816, and 818 may include a first upper conductive pattern 812, a first right conductive pattern 814, a first lower conductive pattern 816, and a first left conductive pattern 818. The third conductive patterns 812, 814, 816, and 818 may be positioned adjacent to the edge of channel 837 of the third sensing transistor 810. The third conductive patterns 812, 814, 816, and 818 are spaced apart from the edge of channel 837 of the third sensing transistor 810 at a predetermined interval. The channel 837 of the third sensing transistor 810 may be approximately quadrangular in a plan view.

The first upper conductive pattern 812 may be disposed adjacent to the upper edge of the channel 837 of the third sensing transistor 810. The first upper conductive pattern 812 and the upper edge of the channel 837 of the third sensing transistor 810 are spaced apart from each other to have a first interval d41. The first upper conductive pattern 812 may overlap the semiconductor 835 of the third sensing transistor 810 and may not overlap the gate electrode 855. In this case, the first upper conductive pattern 812 may overlap the first region 836 of the semiconductor 835.

The first right conductive pattern 814 may be disposed adjacent to the right edge of the channel 837 of the third sensing transistor 810. The first right conductive pattern 814 and the right edge of the channel 837 of the third sensing transistor 810 are spaced apart from each other to have a second interval d42. The first right conductive pattern 814 may overlap the gate electrode 855 of the third sensing transistor 810 and may not overlap the semiconductor 835.

The first lower conductive pattern 816 may be disposed adjacent to the lower edge of the channel 837 of the third sensing transistor 810. The lower edge of the first lower conductive pattern 816 and the channel 837 of the third sensing transistor 810 are spaced apart from each other to have a third interval d43. The first lower conductive pattern 816 may overlap the semiconductor 835 of the third sensing transistor 810 and may not overlap the gate electrode 855. In this case, the first lower conductive pattern 816 may overlap the second region 838 of the semiconductor 835.

The first left conductive pattern 818 may be disposed adjacent to the left edge of the channel 837 of the third sensing transistor 810. The first left conductive pattern 818 and the left edge of the channel 837 of the third sensing transistor 810 are spaced apart from each other to have a fourth interval d44. The first left conductive pattern 818 may overlap the gate electrode 855 of the third sensing transistor 810 and may not overlap the semiconductor 835.

The distance between the third conductive patterns 812, 814, 816, and 818 and the channel 837 of the third sensing transistor 810 may be constant. That is, the first interval d41, the second interval d42, the third interval d43, and the fourth interval d44 may be substantially the same. However, even if the first interval d41, the second interval d42, the third interval d43, and the fourth interval d44 are designed identically, an error occurs in the process, so that at least some of the first interval d41, the second interval d42, the third interval d43, and the fourth interval d44 may be different.

When the shift occurs in third conductive patterns 812, 814, 816, and 818, the same effect as when a foreign object is generated under the channel 837 of the third sensing transistor 810 may occur. For example, the leakage current may occur in the third sensing transistor 810. When a leakage current occurs in the third sensing transistor 810, the leakage current detecting circuit LCDC connected to the sensor ST may detect the leakage current, and the light-emitting element ED connected to the light emitting wiring EDL may emit light. The third conductive patterns 812, 814, 816, and 818 may be positioned on the same layer as the gate electrode 1151 of the polycrystalline transistor Poly TFT, and may be formed using the same mask. Therefore, when the gate electrode 1151 of the polycrystalline transistor Poly TFT is shifted due to the mask misalignment, the leakage current detecting circuit LCDC detects the leakage current and a band-shaped light emitting pattern may appear in the display area DA. Leakage current due to the lower shift of the gate electrode 1151 of the polycrystalline transistor Poly TFT may be mainly influenced by the first upper conductive pattern 812, and leakage current due to the left shift of the gate electrode 1151 of the polycrystalline transistor Poly TFT may be mainly influenced by the first right conductive pattern 814. Leakage current due to the upper shift of the gate electrode 1151 of the polycrystalline transistor Poly TFT may be mainly influenced by the first lower conductive pattern 816, and leakage current due to the right shift of the gate electrode 1151 of the polycrystalline transistor Poly TFT may be mainly influenced by the first left conductive pattern 818.

The display device according to an embodiment includes the conductive pattern positioned on the same layer as a layer constituting the device positioned in the display area DA and the sensor ST including the sensing transistor, and the circuit for detecting the leakage current, so that it may be determined whether the element is properly formed in the designed position. The sensor ST may include the conductive pattern disposed to be spaced apart from the channel of the semiconductor at a predetermined interval under the semiconductor of the sensing transistor, and the leakage current may occur according to the change of the interval between the conductive pattern and the channel of the semiconductor due to the shift of the conductive pattern. In the present embodiment, the case in which the sensor ST includes the first sensor 500 including the conductive pattern positioned on the same layer as the light blocking layer 122, the second sensor 700 including the conductive pattern positioned on the same layer as the first gate conductive layer, and the third sensor 800 including the conductive pattern positioned on the same layer as the second gate conductive layer was described, but the position of the conductive patter is not limited thereto. The sensor may include a conductive pattern positioned in another layer, and thus may detect a shift in another layer.

Next, the display device according to an embodiment is described as follows with reference to FIG. 20 and FIG. 21.

Figure 20:
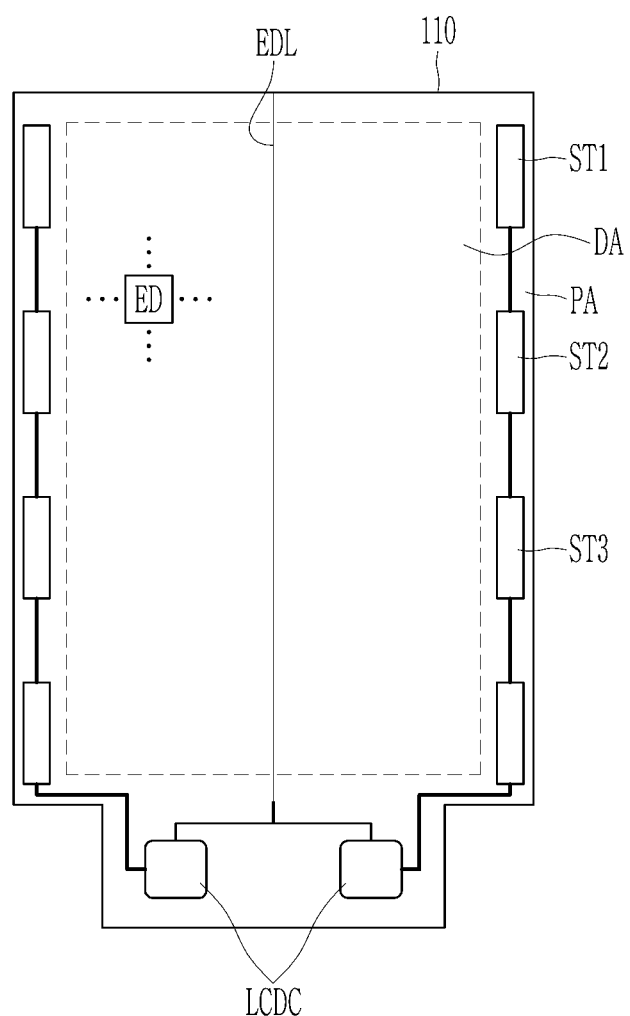
FIG. 20 is a schematic top plan view of a display device according to an embodiment.
Figure 21:
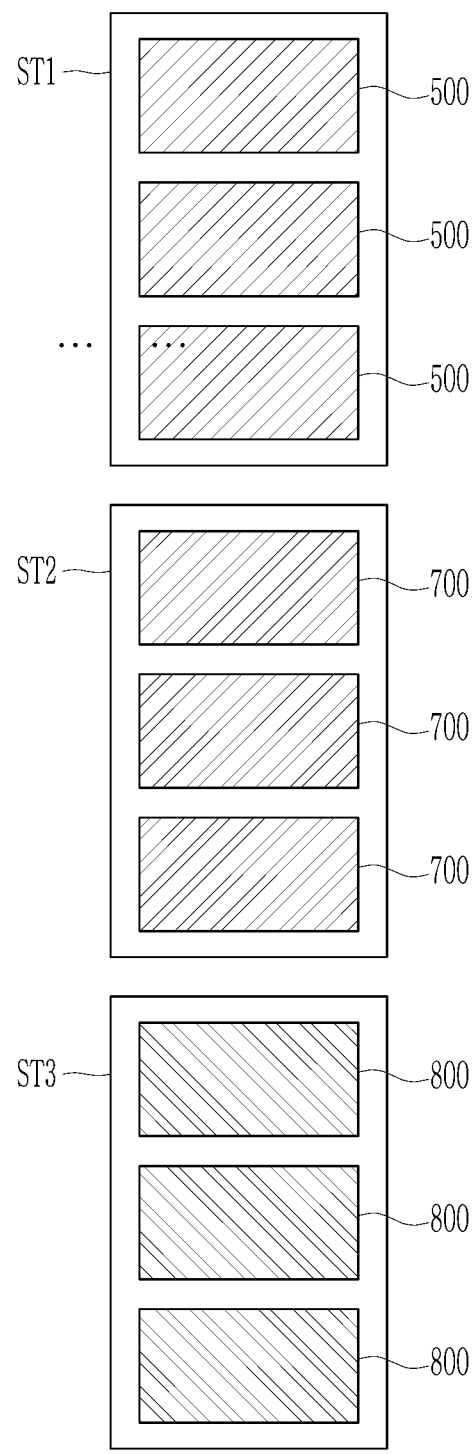
FIG. 21 is a schematic view of a sensor of a display device according to an embodiment.

The display device according to an embodiment shown in FIG. 20 and FIG. 21 is the same as most of the display device of the embodiment shown in FIG. 1 to FIG. 19 so that the description for the same parts is omitted. The present embodiment is different from the previous embodiment in that the sensor includes a first sensor, a second sensor, and a third sensor, and is further described below.

FIG. 20 is a schematic top plan view of a display device according to an embodiment, and FIG. 21 is a schematic view of a sensor of a display device according to an embodiment.

As shown in FIG. 20, the display device according to an embodiment includes a substrate 110, a light-emitting element ED, and a sensor ST positioned on the substrate 110. The light-emitting element ED may be positioned in the display area DA, and the sensor ST may be positioned in the peripheral area PA.

In the above embodiment, a plurality of sensor ST may include a first sensor 500, a second sensor 700, and a third sensor 800, respectively. In the present embodiment, the sensor ST may include a first sensor ST1, a second sensor ST2, and a third sensor ST3 which are spaced apart from one another. As shown in FIG. 21, the first sensor ST1 may include a plurality of first sensors 500, the second sensor ST2 may include a plurality of second sensors 700, and the third sensor ST3 may include a plurality of third sensors 800. The number of first sensors 500, second sensors 700, and third sensors 800 constituting the first sensor ST1, second sensor ST2, and third sensor ST3, respectively, may be variously changed.

The first sensor ST1, the second sensor ST2, and the third sensor ST3 are connected to the leakage current detecting circuit LCDC. The leakage current detecting circuit LCDC may detect the leakage current generated from the first sensor ST1, the second sensor ST2, and the third sensor ST3, and accordingly, it may be determined whether the element positioned in the display area DA is properly formed at the designed position.

Next, the display device according to an embodiment is described as follows with reference to FIG. 22.

Figure 22:
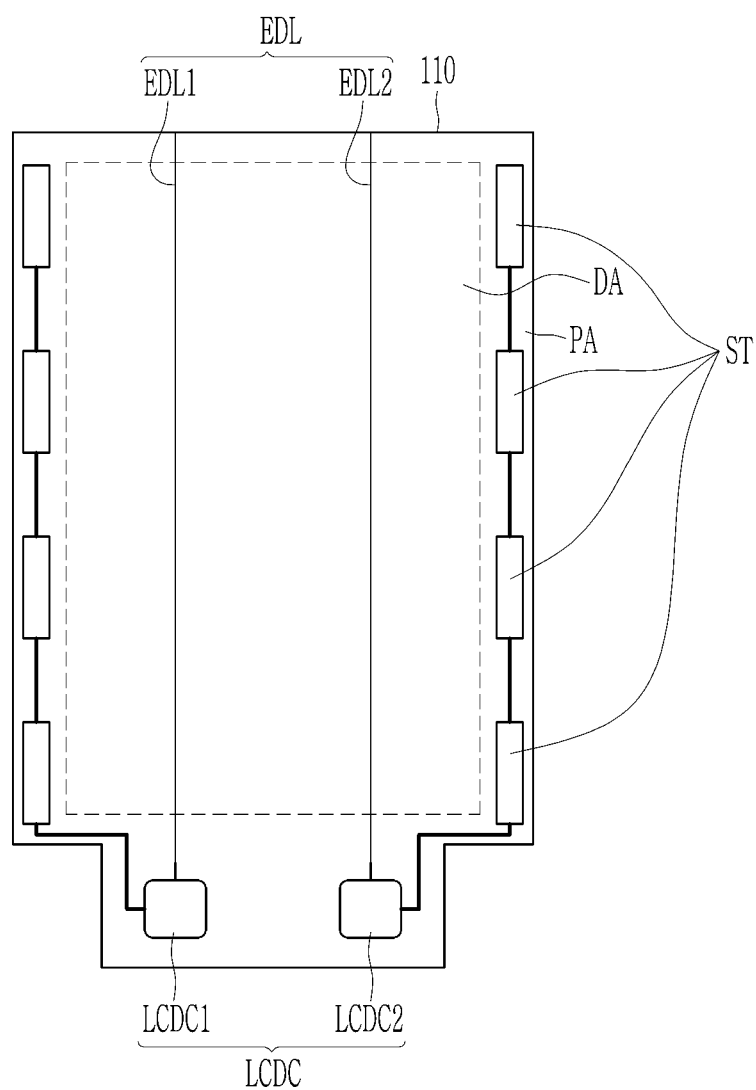
FIG. 22 is a schematic top plan view of a display device according to an embodiment.

The display device according to the embodiment shown in FIG. 22 is the same as most of the display device according to the embodiment shown in FIG. 1 to FIG. 19 so that the description of the same parts is omitted. The present embodiment is different from the preceding embodiment in a point that it includes a plurality of light emitting wirings, and is further described below.

FIG. 22 is a schematic top plan view of a display device according to an embodiment.

As shown in FIG. 22, a display device according to an embodiment includes a substrate 110, and a light-emitting element ED and a sensor ST positioned on the substrate 110. The light-emitting element ED may be positioned in the display area DA, and the sensor ST may be positioned in the peripheral area PA.

The sensor ST is connected to the leakage current detecting circuit LCDC, and the leakage current detecting circuit LCDC is connected to the light emitting wiring EDL. The leakage current detecting circuit LCDC may include a first leakage current detecting circuit LCDC1 and a second leakage current detecting circuit LCDC2. The light emitting wiring EDL may include first light emitting wiring EDL1 and second light emitting wiring EDL2.

The first leakage current detecting circuit LCDC1 may be connected to a plurality of sensors ST positioned on the left side with respect to the display area DA, and may be connected to the first light emitting wiring EDL1. When the leakage current is detected from the first leakage current detecting circuit LCDC1, the light-emitting element ED connected to the first light emitting wiring EDL1 may emit light.

The second leakage current detecting circuit LCDC2 may be connected to a plurality of sensors ST positioned on the right side with respect to the display area DA, and may be connected to the second light emitting wiring EDL2. When the leakage current is detected from the second leakage current detecting circuit LCDC2, the light-emitting element ED connected to the second light emitting wiring EDL2 may emit light.

In this case, the first light emitting wiring EDL1 and the second light emitting wiring EDL2 may be connected to the light-emitting element ED positioned in different columns.

While this disclosure has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
   a substrate including a display area and a peripheral area;
   a plurality of light-emitting elements positioned in the display area;
   a plurality of pixel circuits connected to the plurality of light-emitting elements, respectively;
   a sensor positioned on the peripheral area of the substrate;
   a leakage current detecting circuit connected to the sensor; and
   a light emitting wiring connected to the leakage current detecting circuit and connected to at least one of the plurality of light-emitting elements,
   wherein the sensor includes a first sensor, the first sensor includes:
   a first sensing transistor, and a first conductive pattern spaced apart from a channel of the first sensing transistor, the first conductive pattern being a floating pattern, and wherein the first conductive pattern is positioned in the same layer as at least one of a plurality of layers configuring the plurality of pixel circuits.

2. The display device of claim 1, wherein each of the plurality of pixel circuits includes a polycrystalline transistor and an oxide transistor, wherein the polycrystalline transistor includes:
a polycrystalline semiconductor;
a gate electrode overlapping a channel of the polycrystalline transistor; and
a storage electrode overlapping the gate electrode, and
wherein the oxide transistor includes:
a light blocking layer;
an oxide semiconductor disposed on the light blocking layer to overlap the light blocking layer; and
a gate electrode overlapping a channel of the oxide transistor.

3. The display device of claim 2, wherein the first sensing transistor is positioned on the first conductive pattern.

4. The display device of claim 3, wherein the first sensing transistor includes:
a semiconductor; and
a gate electrode overlapping the channel of the first sensing transistor,
wherein the semiconductor of the first sensing transistor is positioned on the same layer as the oxide semiconductor of the oxide transistor included in one of the plurality of pixel circuits, and
wherein the gate electrode of the first sensing transistor is positioned on the same layer as the gate electrode of the oxide transistor included in one of the plurality of pixel circuits.

5. The display device of claim 4, wherein the first conductive pattern includes:
a first upper conductive pattern disposed adjacent to the upper edge of the channel of the first sensing transistor;
a first right conductive pattern disposed adjacent to the right edge of the channel of the first sensing transistor;
a first lower conductive pattern disposed adjacent to the lower edge of the channel the first sensing transistor; and
a first left conductive pattern disposed adjacent to the left edge of the channel of the first sensing transistor.

6. The display device of claim 5, wherein the first upper conductive pattern is spaced apart from the channel of the first sensing transistor to have a first interval, the first right conductive pattern is spaced apart from the channel of the first sensing transistor to have a second interval, the first lower conductive pattern is spaced apart from the channel of the first sensing transistor to have a third interval, and the first left conductive pattern is spaced apart from the channel of the first sensing transistor to have a fourth interval.

7. The display device of claim 6, wherein the first interval, the second interval, the third interval, and the fourth interval are designed to be the same.

8. The display device of claim 6, wherein the leakage current detecting circuit detects the leakage current of the first sensing transistor caused by a difference between the first interval, the second interval, the third interval, and the fourth interval.

9. The display device of claim 2, wherein the sensor further includes a second sensor, the second sensor includes:
a second sensing transistor; and a second conductive pattern spaced apart from a channel of the second sensing transistor, and
wherein the second sensing transistor is positioned on the second conductive pattern.

10. The display device of claim 9, wherein the second sensing transistor includes:
a semiconductor; and
a gate electrode overlapping a channel of the second sensing transistor,
wherein the semiconductor of the second sensing transistor is positioned on the same layer as the oxide semiconductor of the oxide transistor included in one of the plurality of pixel circuits, and
wherein the gate electrode of the second sensing transistor is positioned on the same layer as the gate electrode of the oxide transistor included in one of the plurality of pixel circuits.

11. The display device of claim 10, wherein the second conductive pattern is positioned on the same layer as the gate electrode of the polycrystalline transistor.

12. The display device of claim 11, wherein the second conductive pattern includes:
a second upper conductive pattern disposed adjacent to the upper edge of the channel of the second sensing transistor;
a second right conductive pattern disposed adjacent to the right edge of the channel of the second sensing transistor;
a second lower conductive pattern disposed adjacent to the lower edge of the channel of the second sensing transistor; and
a second left conductive pattern disposed adjacent to the left edge of the channel of the second sensing transistor.

13. The display device of claim 2, wherein the sensor further includes a third sensor, the third sensor includes:
a third sensing transistor; and
a third conductive pattern spaced apart from a channel of the third sensing transistor, and
wherein the third sensing transistor is positioned on the third conductive pattern.

14. The display device of claim 13, wherein the third sensing transistor includes:
a semiconductor; and
a gate electrode overlapping a channel of the third sensing transistor,
wherein the semiconductor of the third sensing transistor is positioned on the same layer as the oxide semiconductor of the oxide transistor included in one of the plurality of pixel circuits, and
wherein the gate electrode of the third sensing transistor is positioned on the same layer as the gate electrode of the oxide transistor included in one of the plurality of pixel circuits.

15. The display device of claim 14, wherein the third conductive pattern is positioned on the same layer as the storage electrode of the polycrystalline transistor included in one of the plurality of pixel circuits.

16. The display device of claim 15, wherein the third conductive pattern includes:
a third upper conductive pattern disposed adjacent to the upper edge of the channel of the third sensing transistor;
a third right conductive pattern disposed adjacent to the right edge of the channel of the third sensing transistor;
a third lower conductive pattern disposed adjacent to the lower edge of the channel of the third sensing transistor; and a third left conductive pattern disposed adjacent to the left edge of the channel of the third sensing transistor.

17. The display device of claim 1, wherein a plurality of light-emitting elements are disposed along a row direction and a column direction, and
wherein the light emitting wiring is connected to a plurality of light-emitting elements disposed along one column.

18. The display device of claim 1, wherein the display device includes a plurality of sensors,
wherein the leakage current detecting circuit includes:
a first leakage current detecting circuit connected to some of a plurality of sensors, and
a second leakage current detecting circuit connected to the rest of a plurality of sensors.

19. The display device of claim 18, wherein the light emitting wiring includes:
a first light emitting wiring connected to the first leakage current detecting circuit; and
a second light emitting wiring connected to the second leakage current detecting circuit, and
wherein the first light emitting wiring and the second light emitting wiring are connected to light-emitting elements positioned in different columns, respectively.

* * * * *